US008577652B2

(12) United States Patent
Oh

(10) Patent No.: US 8,577,652 B2
(45) Date of Patent: Nov. 5, 2013

(54) SPREADSHEET-BASED GRAPHICAL USER INTERFACE FOR DYNAMIC SYSTEM MODELING AND SIMULATION

(75) Inventor: Kong Ping Oh, Troy, MI (US)

(73) Assignee: XLDyn, LLC, Brighton, MI (US)

( * ) Notice: Subject to any disclaimer, the term of this patent is extended or adjusted under 35 U.S.C. 154(b) by 0 days.

(21) Appl. No.: 12/972,042

(22) Filed: Dec. 17, 2010

(65) Prior Publication Data
US 2012/0054590 A1  Mar. 1, 2012

Related U.S. Application Data

(60) Provisional application No. 61/378,351, filed on Aug. 30, 2010.

(51) Int. Cl.
| G06G 7/48 | (2006.01) |
| G06F 17/00 | (2006.01) |
| G06F 17/20 | (2006.01) |
| G06F 17/21 | (2006.01) |
| G06F 17/22 | (2006.01) |
| G06F 17/24 | (2006.01) |
| G06F 17/25 | (2006.01) |
| G06F 17/26 | (2006.01) |
| G06F 17/27 | (2006.01) |
| G06F 17/28 | (2006.01) |

(52) U.S. Cl.
USPC .............................. 703/6; 715/212

(58) Field of Classification Search
USPC ................ 703/6; 715/222, 255, 212
See application file for complete search history.

(56) References Cited

U.S. PATENT DOCUMENTS

| 6,535,861 | B1* | 3/2003 | O'Connor et al. .............. 706/11 |
| 6,779,151 | B2 | 8/2004 | Cahill et al. |
| 6,883,161 | B1 | 4/2005 | Chovin et al. |
| 7,490,031 | B1* | 2/2009 | Qiu ................................ 703/22 |
| 7,624,372 | B1 | 11/2009 | Stewart |
| 2006/0101391 | A1 | 5/2006 | Ulke et al. |
| 2006/0282818 | A1 | 12/2006 | DeSpain |
| 2008/0092109 | A1* | 4/2008 | Kinnucan et al. ............. 717/105 |
| 2008/0256508 | A1 | 10/2008 | Jonsson |
| 2009/0241089 | A1 | 9/2009 | Ramamoorthy et al. |

OTHER PUBLICATIONS

El-Hajj, Ali et al., "On Using Spreadsheets for Logic Networks Simulation", Nov. 1998, IEEE Transactions on Education, vol. 41, No. 4.*
Bluttman, Ken et al. "Microsoft Office Excel 2007 Formulas & Functions for Dummies", 2007, Wiley Publishing, Inc., pp. (38, 39, 46, 48, 75).*

(Continued)

*Primary Examiner* — Kamini S Shah
*Assistant Examiner* — Cedric D Johnson
(74) *Attorney, Agent, or Firm* — Altera Law Group, LLC; Allen J. Oh

(57) ABSTRACT

A method, computer-readable storage medium, and computer system for modeling a dynamic system comprising a plurality of components are disclosed. A computing device is used to provide a spreadsheet environment and a plurality of shape objects within the spreadsheet environment. The shape objects represent the physical components of the dynamic system. At least one shape object has a behavioral characteristic that is associated with a physical component of the dynamic system. A connector in the spreadsheet environment is used to specify a connection between at least two of the shape objects. The connection represents a relationship between the physical components represented by the connected shape objects.

30 Claims, 35 Drawing Sheets

(56) References Cited

OTHER PUBLICATIONS

PlanMaker, "Manual: PlanMaker 2006", 2006, SoftMaker Software GmbH, pp. 19, 245, 246.*
El-Hajj, Ali, et al. "A Spreadsheet Simulation of Logic Networks", Feb. 1991, IEEE Transactions on Education, vol. 34, No. 1.*
Bissett, Brian D., "Automated Data Analysis Using Excel", 2007, Taylor & Francis Group, LLC., pp. 175-178.*
Kunnen, E. Saskia et al., "Development of Meaning Making: A Dynamic Systems Approach", 2000, New Ideas in Psychology 18, Elsevier Science Ltd.*
Korn, Granino A., "Model Replication Techniques for Parameter-Influence Studies and Monte Carlo Simulation with Random Parameters", Aug. 28, 2004, Mathematics and Computers in Simulation 67 (2005), Elsevier B.V.*
Huang, Qi et al., "Development of a Grid Computing Platform for Electric Power System Applications", 2006, IEEE.*
Gebus, Sebastien et al., "Production Optimization on PCB Assembly Lines Using Discrete-Event Simulation", May 2004, University of OULU, Control Engineering Laboratory, Report A, No. 24.*
Propst, John E. et al., "Improvements in Modeling and Evaluation of Electrical Power System Reliability", Sep./Oct. 2001, IEEE Transactions on Industry Applications, vol. 37, No. 5, IEEE.*
University of Iowa, "DARPA Initiative in Concurrent Engineering Phase 4 and Phase 5", Dec. 1995, College of Engineering, The University of Iowa.*
Altova GmbH. ALTOVA umodel 2006 User and Reference Manual. 2006.
Norfolk, David. Artisan Studio . . . A Standards-Based Tool for Systems and Software Engineering. Sep. 2009.
No Magic, Inc. Cameo Simulation Toolkit Version 17.0.1 User Guide. 2011.
No Magic, Inc. SysML Plugin Version 17.0.1 User Guide. 2011.
Bajaj, Manas. Enabling System Design and Analysis Integration Using a SysML Parametrics-Based Solver Manager. Apr. 29, 2009.
InterCAX LLC. ParaMagic v16.6 sp1 Users Guide. 2009. Atlanta, Georgia, USA.
Urban, Paul. What's New in IBM Rational Rhapsody: Version 7.5. May 28, 2009.
International Business Machines. Rational Rhapsody User Guide. 2009.
Sparx Systems. MDA Overview. 2007.

* cited by examiner

| Table2 | | |
|---|---|---|
| i1 | s1 | s2 |
| 0 | 0 | 2 |
| 1 | 2 | 3 |
| 5 | 4 | 10 |

FIG. 24

SPREADSHEET-BASED GRAPHICAL USER INTERFACE FOR DYNAMIC SYSTEM MODELING AND SIMULATION

RELATED APPLICATION

This application is related by subject matter to copending U.S. patent application Ser. No. 12/967,360, filed Dec. 14, 2010, the entire disclosure of which is hereby incorporated by reference.

TECHNICAL BACKGROUND

The disclosure relates generally to computer-implemented modeling of systems. More particularly, the disclosure relates to user interfaces for dynamic system modeling.

BACKGROUND

Dynamic systems are collections of related entities whose characteristics and behavior change with time. These characteristics and behavior are typically physical in nature, such as mass, spring properties, electrical properties, and the like. For example, automotive powertrains, electrical networks, and oil refineries are dynamic systems. Dynamic systems are governed by a set of differential algebraic equations (or DAE). Software systems known as dynamic systems simulators (DSS) are currently available to obtain and solve these equations for a broad class of problems and to display the results using charts and graphs. Examples of dynamic systems simulators include, for example, the MATLAB® and SIMULINK® environments, AMESim, MapleSim, and OpenModelica.

A modern DSS typically uses a graphical framework capable of forming a computer model of the dynamic system from instances of pre-defined building blocks. For example, an electrical network may be formed from instances of building blocks that represent resistors, capacitors, motors, and other electrical, electronic, or electromechanical components. Similarly, mechanical systems can be constructed from instances of building blocks that represent inertia, gears, springs and other mechanical components.

For forming the model, the framework provides the user with an interface for selecting and dropping a building block unto a canvas, or work area. The user can then connect the building blocks in the same way the dynamic system is constituted in real life. For example, an electrical system model may be constructed by connecting building blocks that represent electrical components much like a schematic diagram. To promote ease of use, the graphical interface should be intuitive to the intended user, e.g., an electrical system model should resemble a schematic diagram. After the user completes the model, a DSS framework can construct and solve the system equations.

Some DSS applications are capable of modeling and simulating systems across multiple domains, e.g., involving building blocks from electrical, mechanical, thermal, and other engineering disciplines. Also, some parts of a system may be difficult to model with basic building blocks provided by the framework. In such cases, most DSS applications provide a programming interface for the user to define the characteristics and behavior of the subsystem in question. This capability is commonly known as user-defined functions, or UDF. Finally, building blocks are often grouped together to form a subsystem, which can in turn be treated as a single building block, or superblock. For example, automotive transmissions often include a torque converter, sets of planetary gears, clutches, and the final drive. These components can be combined to form different transmission subsystems that can be later be connected to different engine subsystems and vehicle models. The use of superblocks provides a structure for modeling families of products and greatly simplifies the modeling process. Unlike basic building blocks, also known as elements, superblocks can be broken down into elements and other superblocks. By contrast, basic building blocks or elements cannot be further decomposed.

Recently, there has been a growing trend toward standardization of modeling languages. Standardization allows one DSS to exchange or share dynamic system models with another DSS. As a result, models are becoming portable, and the user can switch from one DSS to another, which promotes competition among DSS providers. Thus, from an end user perspective, it is important that a DSS support a standard modeling language.

SUMMARY OF THE DISCLOSURE

According to various example embodiments, a spreadsheet is used as a graphical user interface (GUI) for modeling and simulating dynamic systems. A spreadsheet workbook is used to store dynamic system models. The workbook comprises a number of worksheets, which constitute the work area. Shapes, such as rectangles and ovals, and other shape objects may be used as icons for building blocks. Connectors with or without arrows can be used to connect the building blocks. Superblocks are contained in individual worksheets. Worksheets, cells, other spreadsheet objects, and functions and features can be used as they normally would. For example, cell formulas can still be used to perform calculations, and extensive charting capabilities that are available in spreadsheet environments can be used to post-process simulation results. In some embodiments, building block attributes can be used to facilitate constructing a dynamic system model. Such attributes may be persisted within a shape object. In certain embodiments, superblocks can be discovered using a recursive process, and elements contained within a superblock can be connected to other elements within the same or a different superblock. Forms and visual cues may be used to facilitate connecting superblocks, either within a worksheet or across different worksheets. Some embodiments may incorporate these or other features in various combinations.

One embodiment is directed to a method of modeling a dynamic system comprising a plurality of physical components. A computing device is used to provide a spreadsheet environment and a plurality of shape objects within the spreadsheet environment. The shape objects represent the physical components of the dynamic system. At least one shape object has a behavioral characteristic that is associated with a physical component of the dynamic system. A connector in the spreadsheet environment is used to specify a connection between at least two of the shape objects. The connection represents a relationship between the physical components represented by the connected shape objects.

In another embodiment, a computer readable storage medium stores instructions that, when executed by a computer, cause the computer to model a dynamic system comprising a plurality of physical components by providing a spreadsheet environment and a plurality of shape objects within the spreadsheet environment. The shape objects represent the physical components of the dynamic system. At least one shape object has a behavioral characteristic that is associated with a physical component of the dynamic system. A connection between at least two of the shape objects is specified using a connector in the spreadsheet environment. The connection represents a relationship between the physical components represented by the connected shape objects.

Yet another embodiment is directed to a computer system comprising a processor configured to receive and to execute processor-executable instructions and a memory device in communication with the processor and storing processor-executable instructions. When executed by the processor, the instructions cause the processor to model a dynamic system comprising a plurality of physical components by providing a spreadsheet environment and a plurality of shape objects within the spreadsheet environment. The shape objects represent the physical components of the dynamic system. At least one shape object has a behavioral characteristic that is associated with a physical component of the dynamic system. A connection between at least two of the shape objects is specified using a connector in the spreadsheet environment. The connection represents a relationship between the physical components represented by the connected shape objects.

The above summary of various embodiments disclosed herein is not intended to limit the scope of the invention, which is defined solely by the claims.

Additional objects, advantages, and features will become apparent from the following description and the claims that follow, considered in conjunction with the accompanying drawings.

BRIEF DESCRIPTION OF THE DRAWINGS

FIG. 24 illustrates an example named range found during an example search.

DESCRIPTION OF VARIOUS EMBODIMENTS

Figure 1:
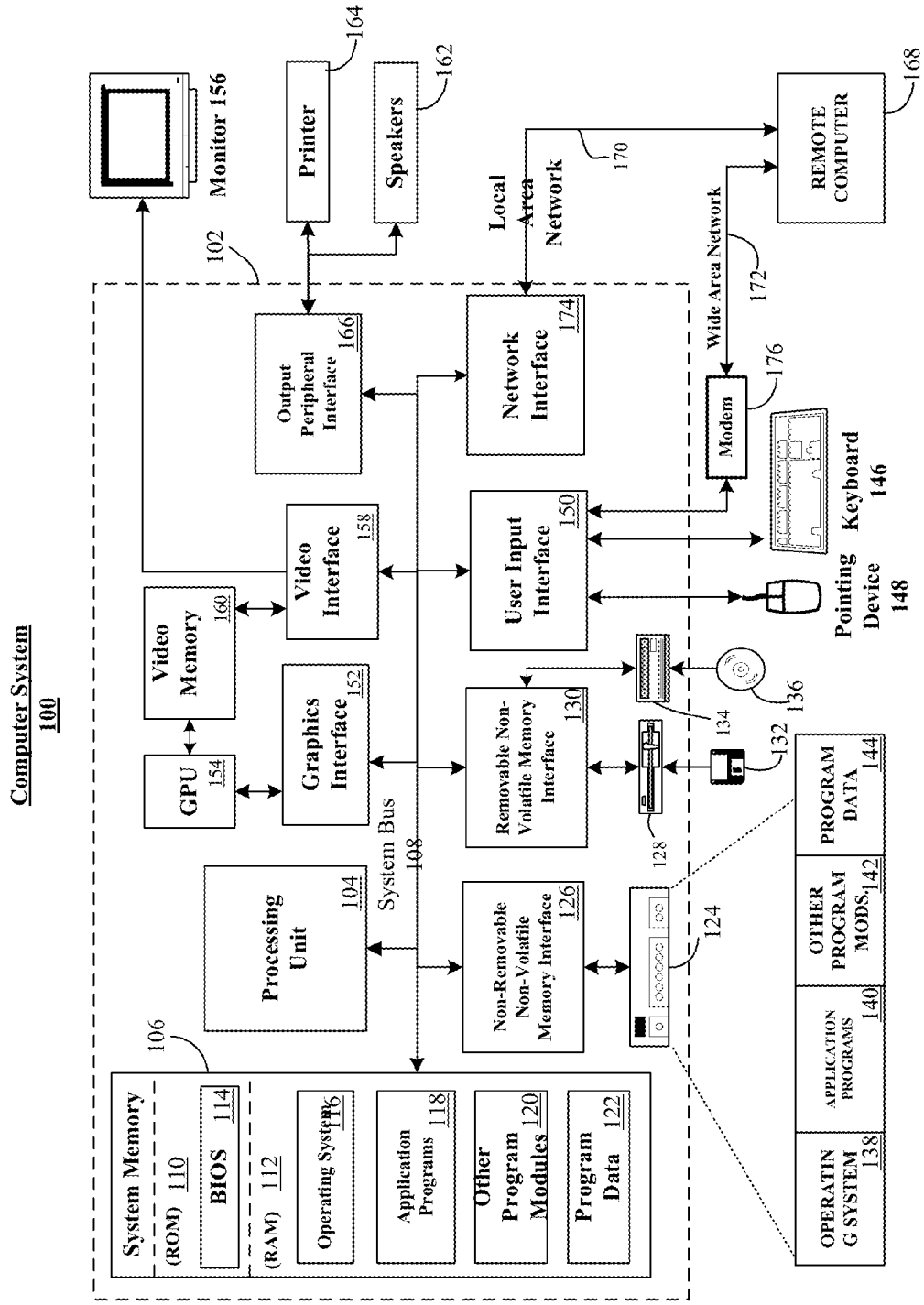
FIG. 1 is a block diagram illustrating a computer system that can be programmed to implement various embodiments.

According to various embodiments, a spreadsheet environment, such as Microsoft's EXCEL® spreadsheet environment or OpenOffice.org Calc, is used as a graphical user interface (GUI) for modeling and simulating dynamic systems. A spreadsheet workbook is used to store dynamic system models. The workbook comprises a number of worksheets, which constitute the work area. Shapes, such as rectangles and ovals may be used as icons for building blocks. Connectors with or without arrows can be used to connect the building blocks. Superblocks are contained in individual worksheets. Worksheets, cells, other spreadsheet objects, and functions and features can be used as they normally would. For example, cell formulas can still be used to perform calculations, and extensive charting capabilities that are available in spreadsheet environments can be used to post-process simulation results. In some embodiments, building block attributes can be used to facilitate constructing a dynamic system model. Such attributes may be persisted within a shape object. In certain embodiments, superblocks can be discovered using a recursive process, and elements contained within a superblock can be connected to other elements within the same or a different superblock. Forms and visual cues may be used to facilitate connecting superblocks, either within a worksheet or across different worksheets. Some embodiments may incorporate these or other features in various combinations.

The following description of various embodiments implemented in a computing device is to be construed by way of illustration rather than limitation. This description is not intended to limit the scope of the disclosure or the applications or uses of the subject matter disclosed in this specification. For example, while various embodiments are described as being implemented in a computing device, it will be appreciated that the principles of the disclosure are applicable to dynamic system simulators operable in other environments, such as a distributed computing environment.

In the following description, numerous specific details are set forth in order to provide a thorough understanding of various embodiments. It will be apparent to one skilled in the art that some embodiments may be practiced without some or all of these specific details. In other instances, well known components and process steps have not been described in detail.

Spreadsheet environments have been used as a graphical user interface (GUI) for many purposes, including building applications, modeling workflow, and modeling business processes. Unlike conventional applications, however, various embodiments described herein use a spreadsheet environment, such as Microsoft's EXCEL® spreadsheet environment or OpenOffice.org Calc, as a GUI for modeling and simulating dynamic systems.

Simulating dynamic systems differs substantially from simulating workflows or performing business analytics in a number of ways. For example, an objective of simulating a dynamic system is to mimic the behavior of related physical or logical entities over time. This may be done, for example, to support system design and validation, e.g., to calculate fuel economy based on characteristics of components. By contrast, while business analytics applications are concerned with collecting data over time, business analytics do not mimic the behavior of systems having physical or logical components. Business analytics are often used in support of business decisions, such as when to buy or sell a stock or when to replenish a supply of a resource. Workflow simulators mimic the flow of work from one station to another, but the stations are generally not assumed to have characteristics or behaviors that are associated with physical properties, and human or machineries are often involved. Example applications of workflow simulators include, for example, calculating throughput, identifying bottlenecks in a workflow, and optimizing resource consumption.

Dynamic systems also differ from business systems and workflows in their building blocks. Dynamic systems are formed from entities that are associated with physical laws that govern how they respond to forces. These laws are modelled using differential-algebraic equations (DAE). In some cases, these characteristics may change over time. In others, they may be constant, particularly if applied forces are constant. By contrast, business systems are made of applications or COM objects that perform data analysis functions. Workflows are made of objects that specify conditions, required resources, and the ways in which tasks are executed.

Different calculations are performed in simulating dynamic systems as compared to simulating workflows or performing business analytics. In a dynamic system simulator, system equations are generated based on connections between building blocks. These system equations are then solved with DAE solvers. A workflow simulator, by contrast, uses if-then-else constructs and arithmetic calculations to simulate the execution of work. A business analytics application uses statistical and mathematics tools on data to calculate metrics, trends, and patterns.

Further, dynamic systems are visualized in different ways from workflows and business systems. The graphical user interface (GUI) for a dynamic system simulator includes dialogs, palettes of building blocks, and connectors to indicate relationships between building blocks. Plots, such as x-y plots, may be used to visualize simulation results. Real-time graphs may be used to show behavior as a simulation progresses. In a workflow simulator, the GUI includes run charts showing resource consumption, task status, and factory output. In a business analytics application, the GUI primarily includes dialogs for capturing data and use sequences. Plots, such as x-y plots, may be used for visualizing trends, and charts, such as pie or bar charts, may be used to show patterns.

Using a spreadsheet environment, such as Microsoft's EXCEL® spreadsheet environment, as a GUI for dynamic system simulation has a relatively quick learning curve and facilitates modeling and analyzing dynamic systems. For example, the user can add instances of building blocks to the canvas and copy, cut, paste, connect, align, and distribute building blocks, all with familiar mouse and/or keyboard commands. Familiar commands can also be used to perform spell checking and other language-related functions, plot analysis results and create charts, write macros to automate modeling and simulation tasks, and access cell formulas. Macros can be written to use functionalities built into the spreadsheet environment. The variety of tasks that can be performed in a dynamic system simulator that uses a spreadsheet environment as the GUI is related to the user's familiarity with the spreadsheet environment. For example, workbooks and worksheets can be used to organize models of subsystems and projects by entities such as authors, revision dates, model contents, etc.

Various embodiments may be described in the general context of processor-executable instructions, such as program modules, being executed by a processor or multiple processors. Generally, program modules include routines, programs, objects, components, data structures, etc., that perform particular tasks or implement particular abstract data types. Certain embodiments may also be practiced in distributed processing environments in which tasks are performed by remote processing devices that are linked through a communications network or other data transmission medium. In a distributed processing environment, program modules and other data may be located in both local and remote storage media, including memory storage devices.

Referring now to the drawings, FIG. 1 is a block diagram illustrating a computer system 100 that can be programmed to implement various embodiments described herein. The computer system 100 is only one example of a suitable computing environment and is not intended to suggest any limitation as to the scope of use or functionality of the subject matter described herein. The computer system 100 should not be construed as having any dependency or requirement relating to any one component or combination of components shown in FIG. 1.

The computer system 100 includes a general computing device, such as a computer 102. Components of the computer 102 may include, without limitation, a processing unit 104, a system memory 106, and a system bus 108 that communicates data between the system memory 106, the processing unit 104, and other components of the computer 102. The system bus 108 may incorporate any of a variety of bus structures including a memory bus or memory controller, a peripheral bus, and a local bus using any of a variety of bus architectures. These architectures include, without limitation, Industry Standard Architecture (ISA) bus, Enhanced ISA (EISA) bus, Micro Channel Architecture (MCA) bus, Video Electronics Standards Association (VESA) local bus, and Peripheral Component Interconnect (PCI) bus, also known as Mezzanine bus.

The computer 102 also is typically configured to operate with one or more types of processor readable media or computer readable media, collectively referred to herein as "processor readable media." Processor readable media includes any available media that can be accessed by the computer 102 and includes both volatile and non-volatile media, and removable and non-removable media. By way of example, and not limitation, processor readable media may include storage media and communication media. Storage media includes both volatile and non-volatile, and removable and non-removable media implemented in any method or technology for storage of information such as processor-readable instructions, data structures, program modules, or other data. Storage media includes, but is not limited to, RAM, ROM, EEPROM, flash memory or other memory technology, CD-ROM, digital versatile discs (DVDs) or other optical disc storage, magnetic cassettes, magnetic tape, magnetic disk storage or other magnetic storage devices, or any other medium that can be used to store the desired information and that can be accessed by the computer 102. Communication media typically embodies processor-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also intended to be included within the scope of processor readable media.

The system memory 106 includes computer storage media in the form of volatile memory, non-volatile memory, or both, such as read only memory (ROM) 110 and random access memory (RAM) 112. A basic input/output system (BIOS) 114 contains the basic routines that facilitate the transfer of information between components of the computer 102, for example, during start-up. The BIOS 114 is typically stored in ROM 110. RAM 112 typically includes data, such as program modules, that are immediately accessible to or presently operated on by the processing unit 104. By way of example, and not limitation, FIG. 1 depicts an operating system 116, application programs 118, other program modules 120, and program data 122 as being stored in RAM 112.

The computer 102 may also include other removable or non-removable, volatile or non-volatile computer storage media. By way of example, and not limitation, FIG. 1 illustrates a hard disk drive 124 that communicates with the system bus 108 via a non-removable memory interface 126 and that reads from or writes to a non-removable, non-volatile magnetic medium, a magnetic disk drive 128 that communicates with the system bus 108 via a removable memory interface 130 and that reads from or writes to a removable, non-volatile magnetic disk 132, and an optical disk drive 134 that communicates with the system bus 108 via the interface 130 and that reads from or writes to a removable, non-volatile optical disk 136, such as a CD-RW, a DVD-RW, or another optical medium. Other computer storage media that can be used in connection with the computer system 100 include, but are not limited to, flash memory, solid state RAM, solid state ROM, magnetic tape cassettes, digital video tape, etc.

The devices and their associated computer storage media disclosed above and illustrated in FIG. 1 provide storage of computer readable instructions, data structures, program modules, and other data that are used by the computer 102. In FIG. 1, for example, the hard disk drive 124 is illustrated as storing an operating system 138, application programs 140, other program modules 142, and program data 144. These components can be the same as or different from the operating system 116, the application programs 118, the other program modules 120, and the program data 122 that are stored in the RAM 112. In any event, the components stored by the hard disk drive 124 are different copies from the components stored by the RAM 112.

A user may enter commands and information into the computer 102 using input devices, such as a keyboard 146 and a pointing device 148, such as a mouse, trackball, or touch pad. Other input devices, which are not shown in FIG. 1, may include, for example, a microphone, a joystick, a game pad, a satellite dish, a scanner, a camera, or the like. These and other input devices may be connected to the processing unit 104 via a user input interface 150 that is connected to the system bus 108. Alternatively, input devices can be connected to the processing unit 104 via other interface and bus structures, such as a parallel port, a game port, or a universal serial bus (USB).

A graphics interface 152 can also be connected to the system bus 108. One or more graphics processing units (GPUs) 154 may communicate with the graphics interface 152. A monitor 156 or other type of display device is also connected to the system bus 108 via an interface, such as a video interface 158, which may in turn communicate with video memory 160. In addition to the monitor 156, the computer system 100 may also include other peripheral output devices, such as speakers 162 and a printer 164, which may be connected to the computer 102 through an output peripheral interface 166.

The computer 102 may operate in a networked or distributed computing environment using logical connections to one or more remote computers, such as a remote computer 168. The remote computer 168 may be a personal computer, a server, a router, a network PC, a peer device, or another common network node, and may include many or all of the components disclosed above relative to the computer 102. The logical connections depicted in FIG. 1 include a local area network (LAN) 170 and a wide area network (WAN) 172, but may also include other networks and buses. Such networking environments are common in homes, offices, enterprise-wide computer networks, intranets, and the Internet.

When the computer 102 is used in a LAN networking environment, it may be connected to the LAN 170 through a wired or wireless network interface or adapter 174. When used in a WAN networking environment, the computer 102 may include a modem 176 or other means for establishing communications over the WAN 172, such as the Internet. The modem 176 may be internal or external to the computer 102 and may be connected to the system bus 108 via the user input interface 150 or another appropriate component. The modem 176 may be a cable or other broadband modem, a dial-up modem, a wireless modem, or any other suitable communication device. In a networked or distributed computing environment, program modules depicted as being stored in the computer 102 may be stored in a remote memory storage device associated with the remote computer 168. For example, remote application programs may be stored in such a remote memory storage device. It will be appreciated that the network connections shown in FIG. 1 are exemplary and that other means of establishing a communication link between the computer 102 and the remote computer 168 may be used.

Figure 2:
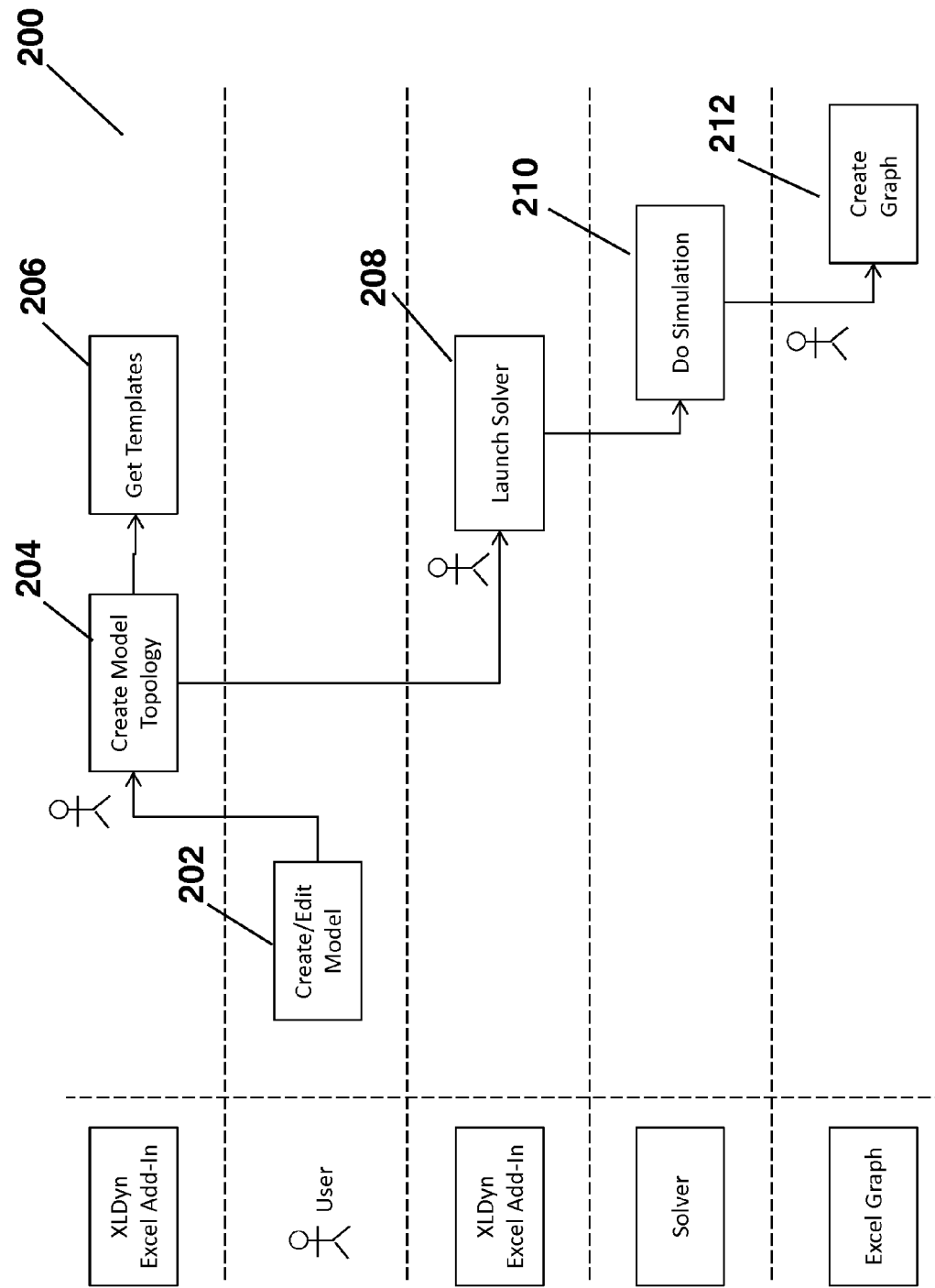
FIG. 2 is a process flow diagram illustrating a process for modeling and simulating a dynamic system according to one embodiment.

FIG. 2 is a swim-lane process flow diagram illustrating some of the steps involved in a method 200 of modeling and simulating a dynamic system according to one embodiment. To start the modeling and simulation process, the user needs to install a set of macros, hereinafter referred to as the XLDyn add-in, which provides additional functionalities to a spreadsheet environment for modeling and simulating dynamic systems. If a third party DSS is used, the user also needs to install system components required by the third party DSS. The XLDyn add-in only needs to be installed once. For each new system model the user wishes to create, the XLDyn add-in provides the capability to insert a new worksheet without grid lines and column and row headers. The user can also insert a new worksheet manually as he or she normally would. After inserting the new worksheet, the user can create, delete, or edit building blocks on the new worksheet to form a system model, as shown at a step 202.

After completing the system model, the user can click on a command button to create a system topology, which is a listing of building blocks that constitute the system model, at a step 204. The system topology also describes how the building blocks are connected to one another. The system topology is written to a special worksheet hereinafter referred to as XLDyn Topology. The XLDyn add-in will determine whether the XLDyn Topology worksheet already exists. If so, its contents are written over. If not, the XLDyn Topology worksheet is created. In addition, the XLDyn add-in imports any required templates, as shown at a step 206. The model description file, which contains the topology information in a format specific to the third party DSS, is also created at this time.

After the system topology is created, the user can proceed to simulate the system by launching a solver at a step 208. The XLDyn add-in will check for the existence of certain worksheets. One worksheet, hereinafter referred to as the XLDyn Parameters worksheet, contains information such as accuracy, solution method, solution time, etc., and is read by a solver to set default values at the beginning of the simulation. If the model is exported to a third party dynamic system simulator (DSS), the simulation parameters contained in the XLDyn Parameters worksheet are exported along with the system model. Another worksheet, hereinafter referred to as the XLDyn Data worksheet, contains data shared between the built-in solver and the user-defined functions (UDF). If a third party DSS is used to simulate the system, the XLDyn Data worksheet should be modified for communication with the third party DSS as needed, to the extent that interoperability with the spreadsheet environment is supported by the third party DSS. Still another worksheet, hereinafter referred to as the XLDyn Results worksheet, stores simulation results produced by the XLDyn equation solver or by a third party DSS when the solver performs the simulation at a step 210. As in the case of the XLDyn Topology worksheet, any of these worksheets that already exist are written over. Any worksheets that do not already exist are created. After the solver has performed the simulation and generated the XLDyn Results worksheet, the spreadsheet environment may create graphs or other visualizations at a step 212.

Any of the XLDyn workbooks can be treated like any other workbook in the spreadsheet environment. For example, the XLDyn workbooks can be shared, copied, and re-opened for editing or simulation using different parameters.

To leverage existing models and component libraries, a modeling environment may be able to read and write third party model description files, particularly those supported by a set of language standards. One embodiment, for example, includes a file parser and writer for the MODELICA® equation-based language, a model description standard that is rapidly gaining acceptance. Other embodiments may include file parsers and writers for a number of proprietary dynamic system simulators, such as the MATLAB® and SIMULINK® environments and AMESim.

According to various embodiments described herein, objects in a spreadsheet environment, such as Microsoft's EXCEL® spreadsheet environment, are used to represent entities used in dynamic system modeling and simulation. Dynamic systems are stored in workbooks each comprised of one or more worksheets. Subsystems that constitute a system are stored in worksheets, one worksheet for each subsystem, and each worksheet that represents a subsystem may have a name that corresponds with the name of the subsystem that it represents. Worksheets constitute the work area, where building blocks are created, edited, and connected to form a system model.

Figure 3:
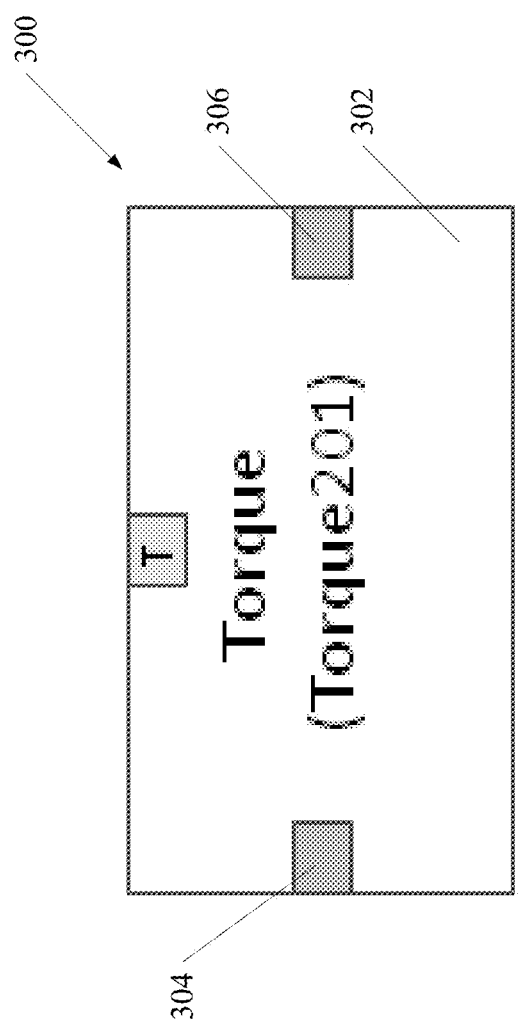
FIG. 3 illustrates a building block used in the process of FIG. 2.

Shapes are used as icons for building blocks. For example, a group of rectangles may be used to represent a building block. FIG. 3 illustrates an example building block 300. The building block 300 includes a large shape 302 known as a base block. The base block is used to differentiate a building block type, e.g., torque, from other building block types, e.g., inertia. The building block 300 also includes smaller shapes 304 and 306 that are used as connection points for connecting with other building blocks.

Building blocks in one worksheet, known as the reference model, may be connected to building blocks in other worksheets. In such cases, the latter worksheet is said to be a superblock, that is, a submodel, referenced by the former model, i.e., the reference model. Building blocks can be connected together using a variety of connectors. Some such connectors, such as elbows and curved connectors, indicate physical connections or flow of information. Other connectors, such as straight lines and arcs, may be used as they would normally be used in the spreadsheet environment.

Cell ranges are used to store values, vectors, and tables needed in dynamic system simulation. For example, the torque applied to a mass may be a function of time. The attribute for the torque input is thus described by a two-dimensional table, which can be stored as a cell range in the spreadsheet environment. Named ranges are particularly useful because they can be referenced easily.

Other objects in the spreadsheet environment, including, but not limited to pictures, ActiveX controls, macros, charts, etc., may retain their functions and features as defined by the spreadsheet environment and can be used as they would otherwise be used in the spreadsheet environment.

Macros can be used as user-defined building blocks. The construction of a user-defined building block may follow a general procedure. This procedure may use a callback function to change the values of system variables, which are passed as parameters to the user-defined functions (UDF). The user may specify changes as needed, depending on the time and stage of simulation. This procedure is followed by many conventionally available dynamic system simulators and, in one embodiment, is also followed by the XLDyn add-in.

Figure 4:
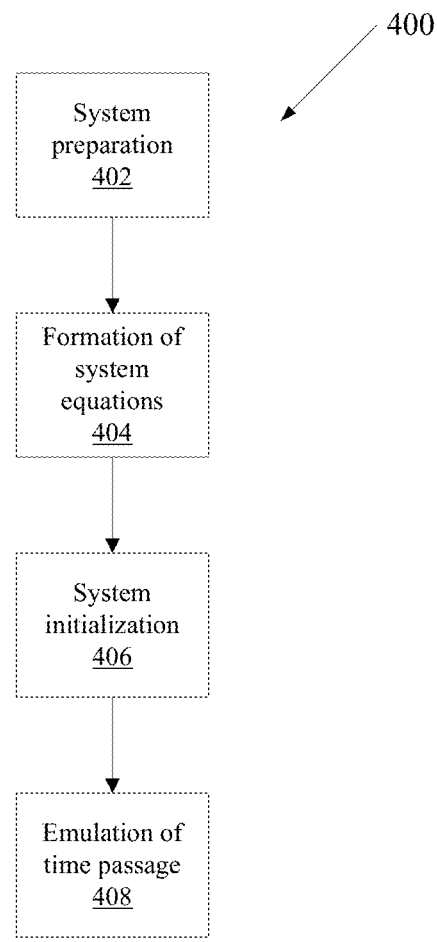
FIG. 4 is a process flow diagram that illustrates an example process for using a macro as a callback function.

FIG. 4 is a process flow diagram that illustrates an example process 400 for using a macro as a callback function. A dynamic systems simulator (DSS) application calculates the values of state variables, such as velocity and voltage, as a function of time. The process 400 includes at least four broadly-defined steps.

At a step 402, data that is needed for the simulation is read into memory. This data includes building block attributes, simulation parameters, and the method for solving the DAE that govern the state variables.

At a step 404, the system equations are formed. In this step, memory locations are allocated and populated based on building block attributes and connectivity. The memory contents are cast in the canonical matrix form that relates the state variables to external forces.

At a step 406, the system is initialized. As part of this initialization, state variables are set to their initial values at the start of the simulation. At a step 408, the passage of time is emulated. An iterative loop increments the value of a variable, namely, time, until a terminal point is reached. In this iterative loop, state variables x are evaluated using the approximation $$x_i = x_{i-1} + \dot{x}(u, x_{i-1}) \Delta t,$$

which states that the current value of a state variable x is equal to its previous value plus the change over a small time step. Values of state variables over time may be written to a file as soon as they are updated. Alternatively, they may be used to update a real-time graph. As another alternative, the values may be stored in internal memory for output at a later time.

By way of example and not limitation, a user-defined block can be used to generate a sinusoidal torque that is then used as an input to a simple spring-mass system. To create the user-defined block, the user first authors the macro and gives it a name, such as TestMacro. The macro TestMacro specifies how the torque varies with time. One example implementation of the macro TestMacro may involve the following code:

```
Sub TestMacro(ActionCode As Integer, t As Double, _
              input_s( ) As Double, u( ) As Double)
    Const SetUp As Integer = 1
    Const InitializeState As Integer = 2
    Const UpdateSignal As Integer = 3
    Const UpdateRate As Integer = 4
    Select Case ActionCode
        Case InitializeState
        Case SetUp
        Case UpdateRate
        Case UpdateSignal
            If t < 1 Then
                Range("Out_Signals").Cells(1, 1) = 10 * Sin(6.2832 * t)
            Else
                Range("Out_Signals").Cells(1, 1) = 0
            End If
    End Select
End Sub
```

Figure 5:
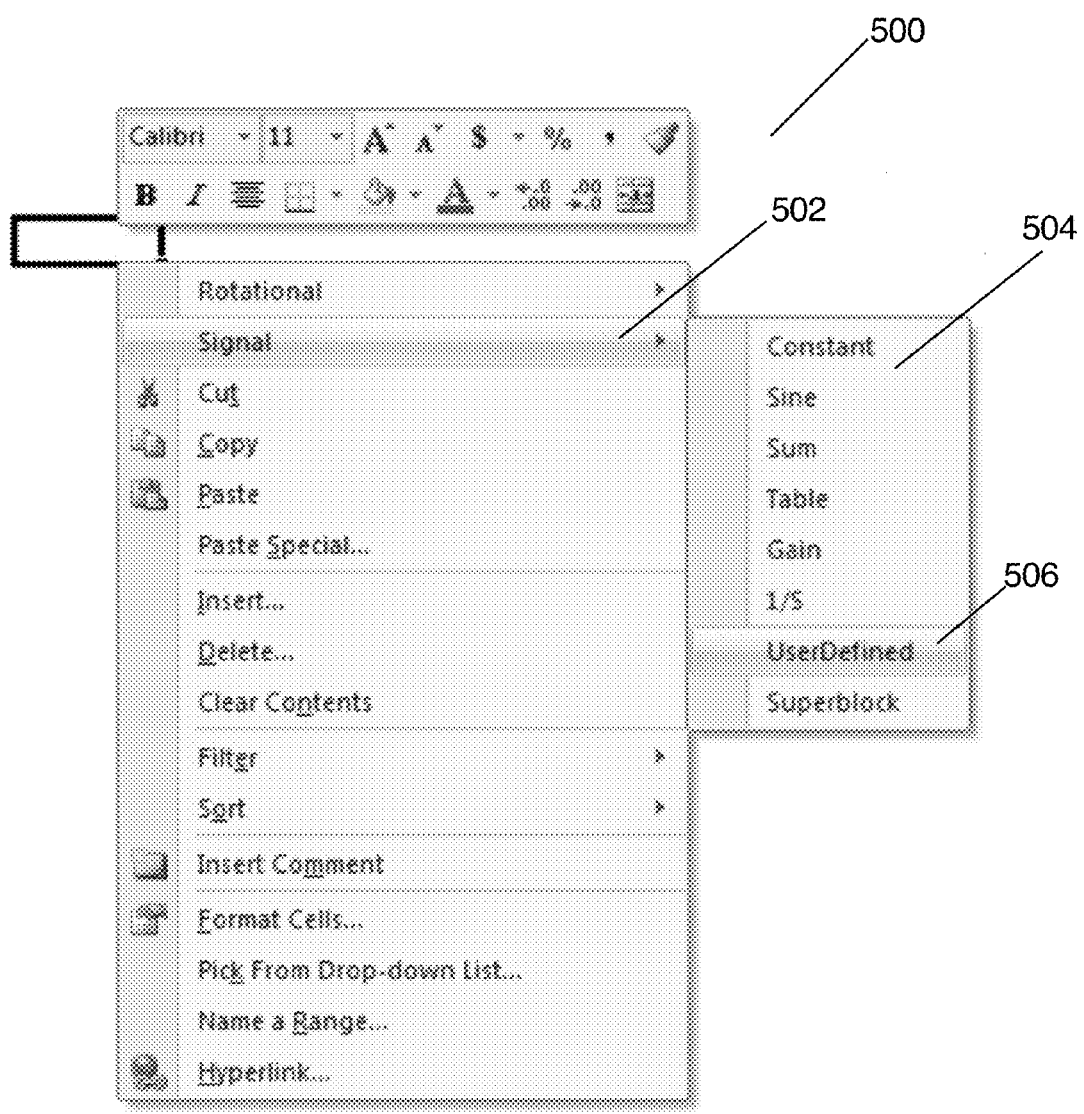
FIG. 5 illustrates a menu that is presented in connection with the process of FIG. 4.

After the macro is authored, the user identifies a desired screen location, e.g., by right-clicking on the location, causing a menu 500 to appear as shown in FIG. 5. The user then selects a "Signal" option 502 from the menu 500, causing a fly-out menu 504 to appear. Next, the user selects a "UserDefined" option from the fly-out menu 504.

Figure 6:
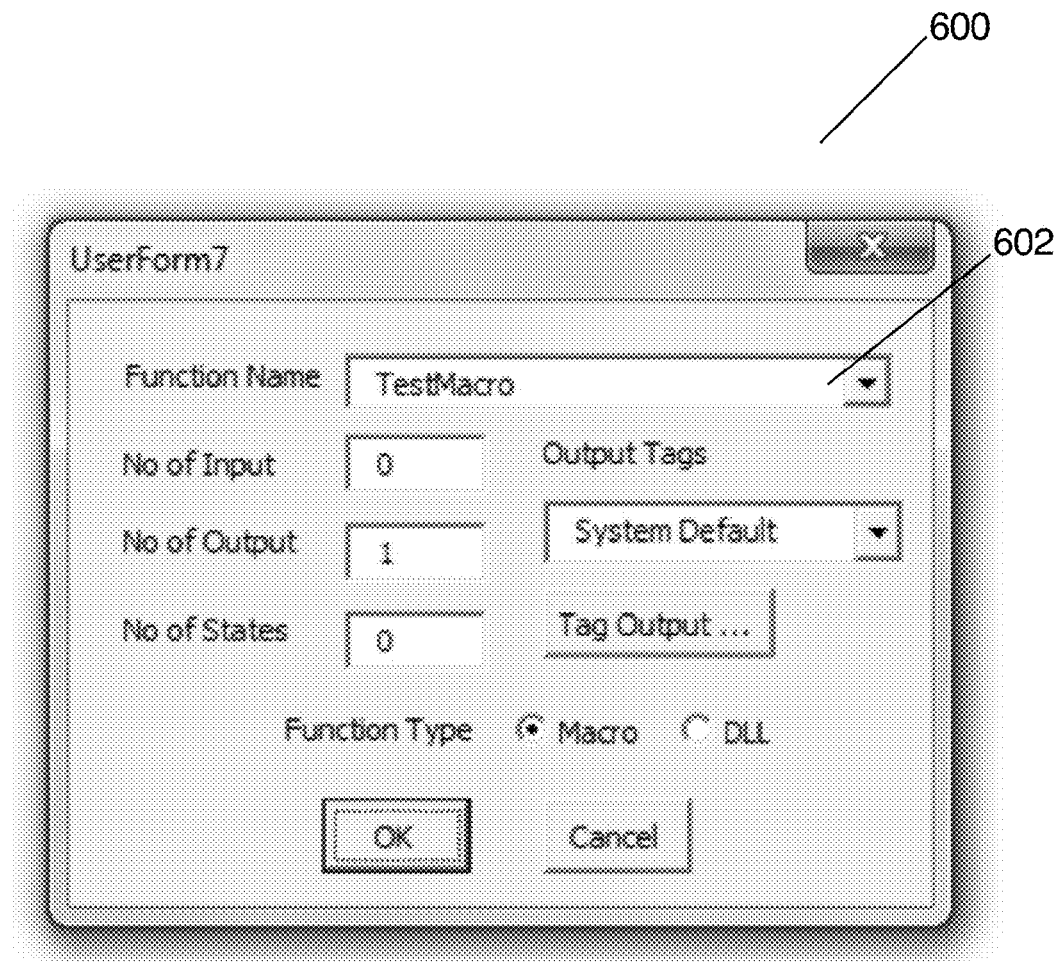
FIG. 6 illustrates a dialog box that is presented in connection with the menu of FIG. 5.

A dialog box 600, shown in FIG. 6, then appears. The user can then enter the relevant information using the dialog box 600. As shown in FIG. 6, a combobox 602 for Function Name is populated with macros available in the instant workbook, including the macro TestMacro.

Figure 7:
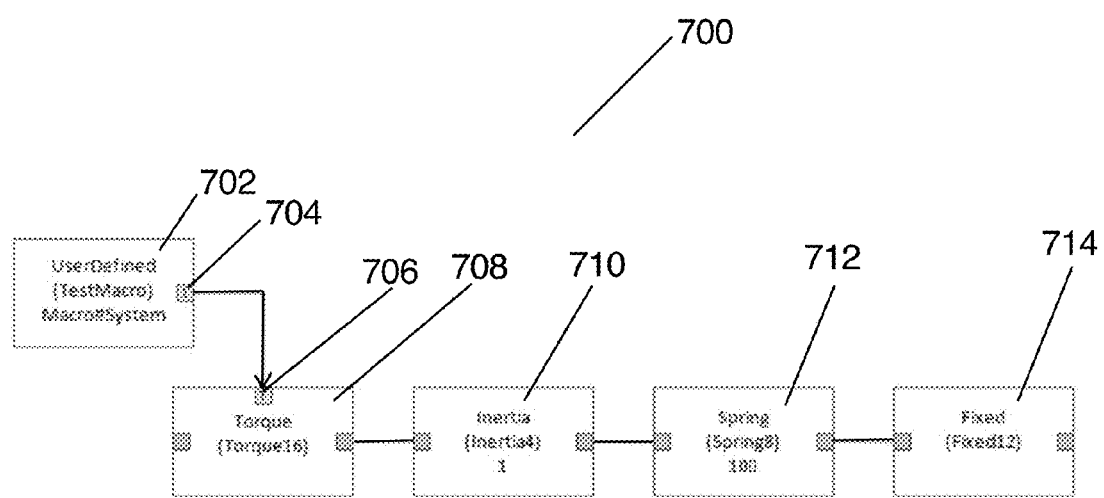
FIG. 7 illustrates an example system model.

After entering the information for the macro TestMacro, the user completes the system model by using native connectors in the EXCEL® spreadsheet environment to connect building blocks together. FIG. 7 illustrates an example system model 700 in which a block 702 has an output 704 that is connected to an input 706 of a block 708 representing torque. The block 708 is connected to a block 710 representing inertia, which is connected to a block 712 representing a spring. The block 712 is connected to a block 714 that identifies the spring as a fixed spring.

After the system model is completed, it can be simulated using the broadly-defined process 400 of FIG. 4. The dynamic systems simulator (DSS) passes the parameter ActionCode in the above macro. If the parameter ActionCode has a value of 1, then at step 402, the DSS prepares the system. In this example, the user-defined function (UDF) is hard-coded to generate one full cycle of a sinusoidal signal. No external data is needed; the UDF does not need to take any action. If the parameter ActionCode has a value of 2, then at step 406, the system is initialized. No state is associated with the sinusoidal generator, and the UDF does not need to take any action. If the parameter ActionCode has a value of 3, the DSS updates the rate of change of state variables, $\dot{x}$. Since no state is associated with the sinusoidal generator, the UDF does not need to take any action. If the parameter ActionCode has a value of 4, then at step 408, the DSS updates the signals, u. In this case, the UDF needs to write the value of the sinusoidal signal for each time, t, to the named range Out_Signals. The UDF then uses the value at this cell location as an input to the block 708.

This example illustrates the desirability for the DSS to invoke the macro and to exchange data with the macro. These functions are facilitated by interoperability between MICROSOFT OFFICE® software and .NET. In particular, third party DSS applications may not be able to use the macro or exchange data with the macro if they do not have this interoperability or if they do not use the simulation approach described herein.

For simulation using a third party DSS, the UDF should be written in a language supported by the DSS. For example, for a third party DSS that supports the MODELICA® equation-based language, the UDF should be written as a text file that contains the class definition of the user defined building block. The following example class definition may achieve this purpose:

```
block TestMacro "Generate sine signal"
    parameter Real amplitude = 10 "Amplitude of sine wave";
    parameter SIunits.Frequency freqHz = 1 "Frequency";
    extends Interfaces.SO;
protected
    constant Real pi = Modelica.Constants.pi;
equation
    y = if time < 1 then 0 else
        amplitude * Modelica.Math.sin(2 * pi * freqHz * time);
end TestMacro;
```

In the above example class definition, it should be noted that the sine signal block is a standard component whose class definition includes comments, graphical annotation, and additional parameters. These additional attributes are not shown in this example, which is intended to illustrate the basic structure and components of a model in the MODELICA® equation-based language.

Figure 8:
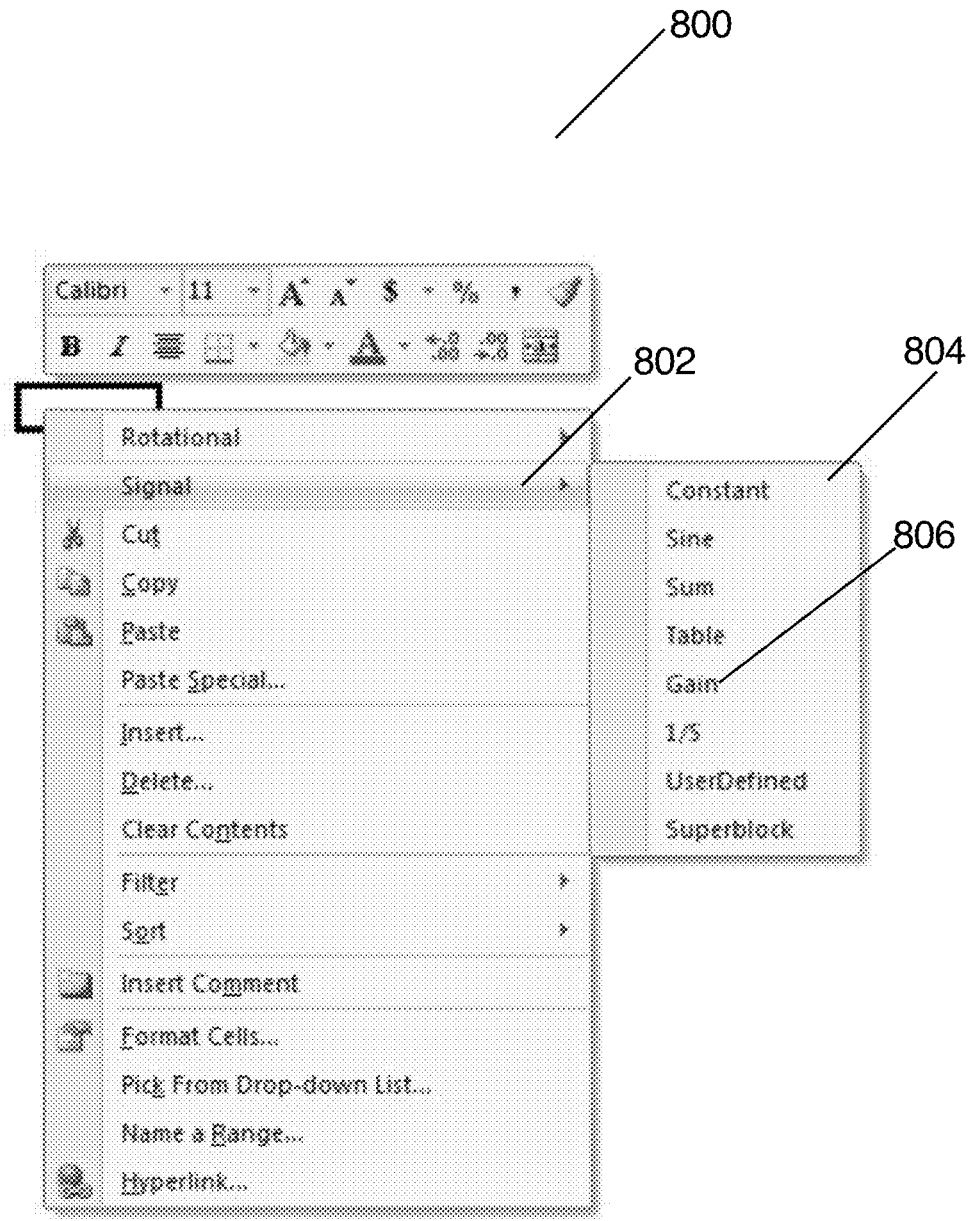
FIG. 8 illustrates a menu for creating a building block instance.

In another aspect, shape objects and functions in the EXCEL® spreadsheet environment can be used to facilitate the creation and editing of dynamic system models. The XLDyn add-in may use a "select and click" method to create instances of a building block. In particular, in some embodiments, the XLDyn add-in modifies the command bar menu to include families of building blocks, such as Rotational and Signal Flow building blocks. In such embodiments, to add an instance of a building block to a worksheet, the user right-clicks on a cell. This action causes a mini command bar menu to appear. An example menu 800 is shown in FIG. 8. The user then selects a family of building blocks, for example, by clicking or mousing over a "Signal" option 802 on the menu 800. A fly-out menu 804 then appears, from which the user can select a particular type of building block, for example, by clicking on a "Gain" option 806.

Figure 9:
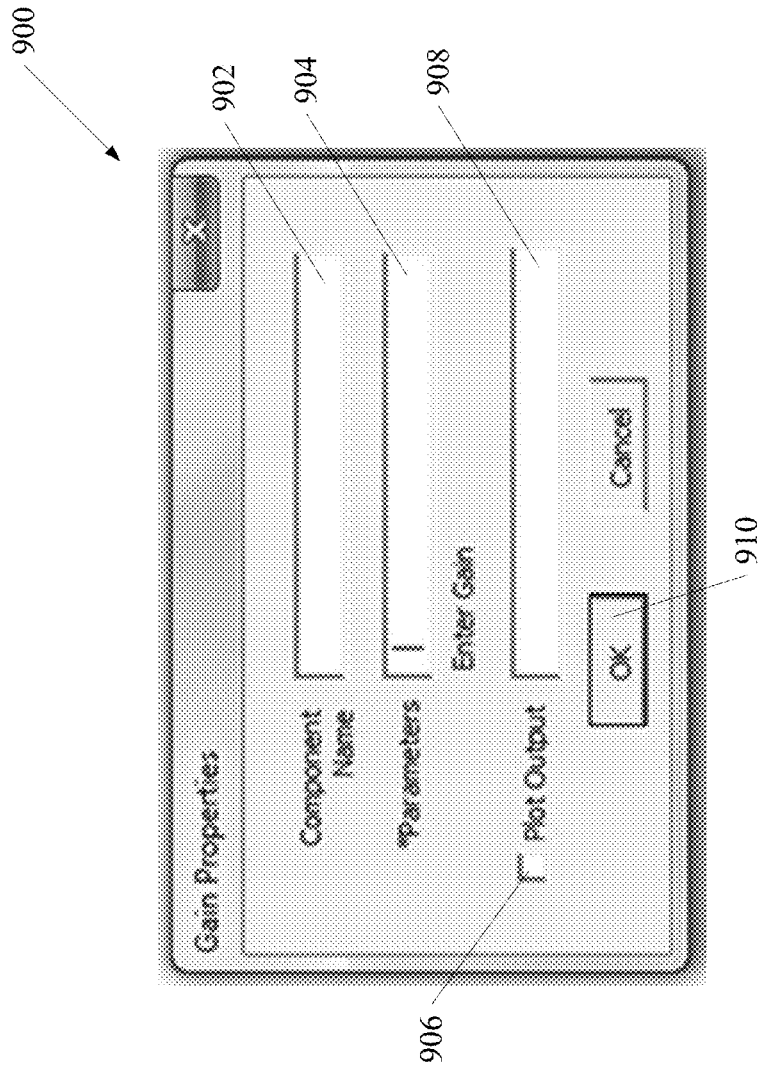
FIG. 9 illustrates a dialog box that is presented in connection with the menu of FIG. 8.

When the user selects a Gain building block, a dialog box appears. FIG. 9 shows an example dialog box 900 that is used to enter attributes of the Gain building block. The dialog box 900 includes input fields 902 and 904 for entering the name and gain, respectively, of the Gain building block. A checkbox 906 and a corresponding input field 908 are used to generate and label x-y plots from the simulation. The XLDyn add-in produces an x-y plot for each tagged output. The dialog box 900 may also be presented when the user wishes to edit an existing building block instance. To edit the attributes of an instance of a building block, the user selects the group icon and invokes the "Edit Block" function provided by the XLDyn add-in. The XLDyn add-in then displays the dialog box 900. In this case, the input fields 902, 904, and 908 and the checkbox 906 are pre-populated with their current values.

When the user clicks an "OK" button 910, the XLDyn add-in places an instance of the Gain building block near the cell that the user had selected earlier. The Gain building block may contain text information, such as the type of building block ("Gain," for example) and a unique identifier. By default, the XLDyn add-in gives the building block a unique label that is displayed in parentheses, such as "(Gain13)." The label may be obtained by concatenating the building block type ("Gain") with the sequence number (13) provided by the EXCEL® spreadsheet environment for the base block. The EXCEL® spreadsheet environment assigns a number to each shape that it creates. When shapes are grouped, the EXCEL® spreadsheet environment considers the group a new shape and assigns it a number. Thus, in this example, four shapes are created: a base block that has three lines of text, two connection points, and the group comprising the base block and the two connection points. The block attribute, e.g., a gain of 1.5, is also displayed. Labels may help the user identify different instances of a building block type. Labels are also used to name class instances in the MODELICA® equation-based language.

An alternative way to create a building block is a "drag and drop" approach. In this approach, the user selects and drags a building block from a palette and drops the selected building block at a worksheet location. The "select and click" method may be easier for a user to execute in that it involves less mouse movement and fewer mouse clicks.

The XLDyn add-in may assign a unique name to each building block instance when the instance is created. One way to construct the name is to concatenate the unique shape identifier assigned by the EXCEL® spreadsheet environment with the building block label and type. For example, the XLDyn add-in may assign one building block instance the name Group4|Inertia1|Inertia. This convention allows the XLDyn add-in to distinguish dynamic system building blocks from other shapes on a spreadsheet. In other words, the XLDyn add-in recognizes only a limited set of shapes that can be used to form a system model. Shapes outside the set, such as pictures, buttons, textboxes, etc., may be used for other purposes as they normally would.

In some embodiments, the XLDyn add-in assigns each connection point on a building block a color that identifies the type of the connection point. For example, an input or output port may be assigned the color yellow, while nodes, which mimic physical connection points, may be assigned the color purple. Other colors may be assigned to nodes in other engineering disciplines. Color coding the connection points helps prevent the user from making an improper connection between building blocks.

The user may make copies of building blocks or groups of building blocks. When the user copies and pastes a building block (or a group of building blocks) with the copy/paste function in the EXCEL® spreadsheet environment, the shape name is duplicated in the copy, including the attributes that had been concatenated with the original shape name. To avoid confusion between the original instance and the copied instance, the XLDyn add-in includes an algorithm that adds a version number to the original shape name. For example, if the original shape name is Rectangle 15, then the name of the first copy is Rectangle 15_1, the second copy is Rectangle 15_2, etc.

In another aspect, the XLDyn add-in facilitates persisting building block attributes within a shape object. The behavior of dynamic systems depends on the characteristics of its components. These characteristics include, e.g., inertia, initial velocity, spring rate, and system gain. In addition, a building block may also have non-physical attributes such as Name, Type, Identifier (ID), etc. According to this aspect, the XLDyn add-in may store the attributes within the Group Shape object by concatenating them with the Group Shape object's Name, with items separated by delimiters. Alternatively, the characteristics and non-physical attributes may be stored in files external to the EXCEL® spreadsheet environment or in a worksheet.

Persistence of building block attributes within a shape object is more efficient than other methods of persisting building block attributes. For example, if the user deletes a shape object, the associated attributes are automatically deleted. Accordingly, there is no need to maintain the association between the icon and the external data storage area and no need to delete the associated record from the external storage. Also, a building block's attributes can be obtained easily by "unpacking" the modified shape name, i.e., extracting the tokens using the appropriate delimiters. This feature is useful when a user wants to change the attributes of a building block.

Figure 10:
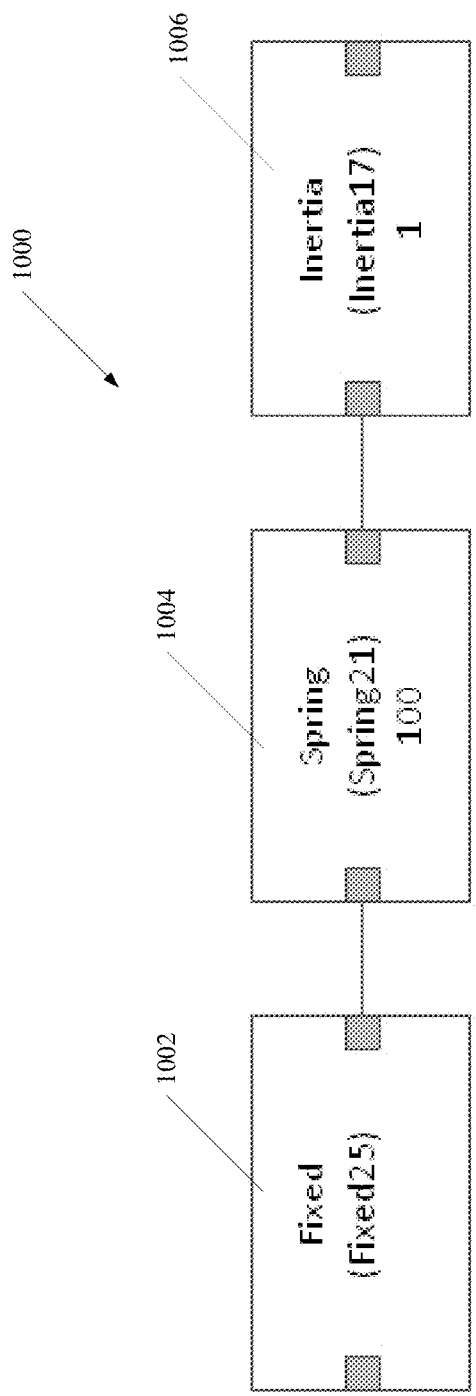
FIG. 10 illustrates an example system model.

According to another aspect, building block attributes can be used to facilitate construction of the system model. A system model is often described by a model description file, which is a listing of all of the components along with their properties and a description of how the components are connected to one another. For example, the following Table 1 represents a model description file that describes a system having three building blocks, namely, Fixed (or ground), Spring, and Inertia. Fixed has a connection identified as 1, and Inertia has a connection identified as 5. Spring has connections at two sides identified as 1 and 5, respectively. Accordingly, the model description file represented in the following table is a textual representation of the system 1000 shown in FIG. 10:

TABLE 1

| Type | Name | Property | Connection |
| --- | --- | --- | --- |
| Fixed | Fixed25 | | 1 |
| Spring | Spring21 | 100 | 1, 5 |
| Inertia | Inertia17 | 1 | 5 |

The system 1000 includes building blocks 1002, 1004, and 1006, which are connected to one another as described above.

Figure 11:
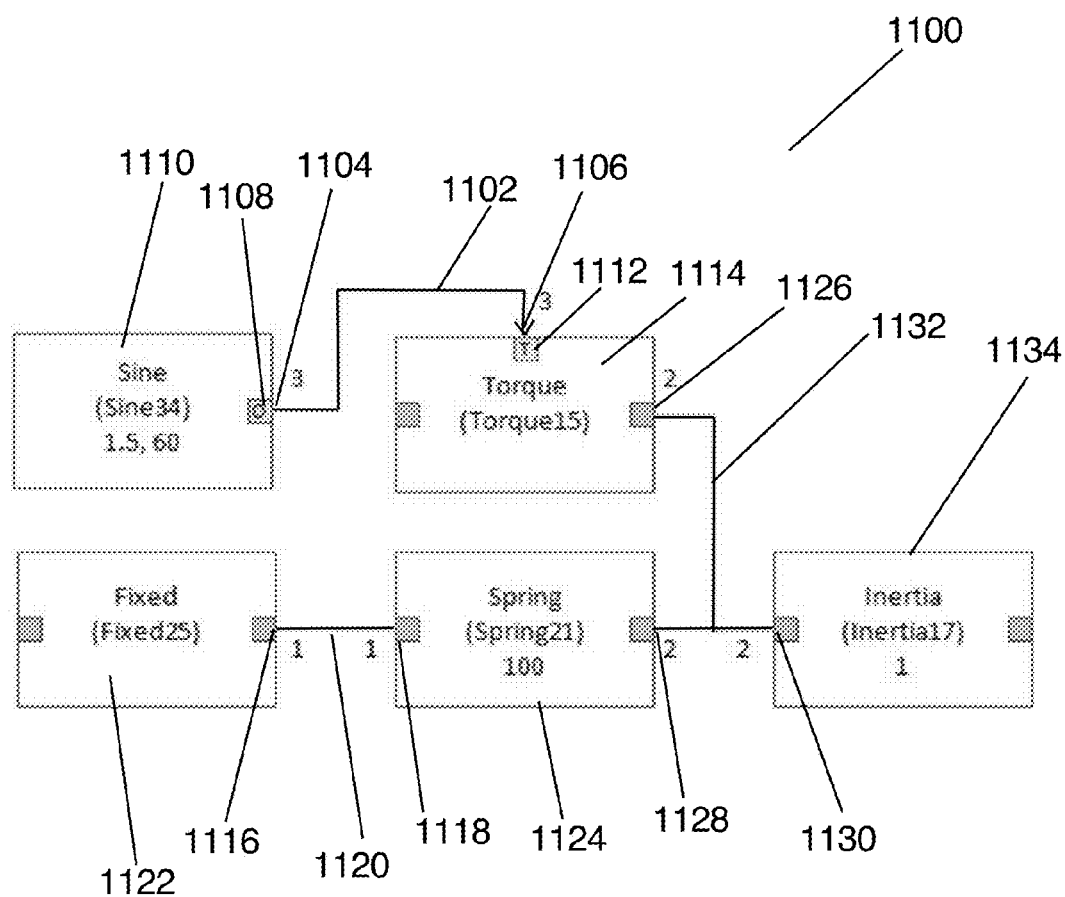
FIG. 11 illustrates an example graphical representation of a system.

The model description file can be generated from its corresponding graphical representation. When the user clicks a command button to create the topology that is used to generate the model description file, the XLDyn add-in scans the active worksheet for certain connectors, such as elbow connectors and curved connectors, that are connected to shapes whose name attribute contains a predefined delimiter, such as the vertical bar character "|." For each such connector, the XLDyn add-in assigns a number or other symbol to each of its endpoints. Alternatively, the XLDyn add-in may assign other symbols to the endpoints, such as non-numeric characters or strings of characters. FIG. 11 illustrates an example graphical representation 1100 of a system with numbers assigned to endpoints of connectors by the XLDyn add-in. As shown in FIG. 11, a connector 1102 has two endpoints 1104 and 1106 that are assigned the number 3. The endpoint 1104 is connected to an output 1108 of a Sine building block 1110, and the endpoint 1106 is connected to an input 1112 of a Torque building block 1114. Similarly, the number 1 is assigned to endpoints 1116 and 1118 of a connector 1120, which are connected to a Fixed building block 1122 and a Spring building block 1124, respectively. The number 2 is assigned to endpoints 1126, 1128, and 1130 of a connector 1132, which are connected to the Torque building block 1114, the Spring building block 1124, and an Inertia building block 1134, respectively. Two building blocks, such as the Sine building block 1110 and the Torque building block 1114, are connected when they share the same connection number, e.g., 3. The connection numbers do not need to be sequential, but they do need to be unique. For example, the same connection number cannot be assigned to the connection 1102 between the Sine building block 1110 and the Torque building block 1114 and the connection 1120 between the Fixed building block 1122 and the Spring building block 1124. The uniqueness of connection numbers is achieved by the XLDyn add-in maintaining a one-to-one mapping between the connection point shape names and the connection numbers.

The topology produced by the XLDyn add-in for the system represented in FIG. 11 is written to a worksheet XLDyn Topology in a netlist format, an example of which is provided in the following Table 2:

TABLE 2

| Type | Label | Property | Node ID | Input ID | Output ID |
|---|---|---|---|---|---|
| Inertia | Inertia17 | 1 | 2 | | |
| Spring | Spring21 | 100 | 1, 2 | | |
| Fixed | Fixed25 | | 1 | | |
| Torque | Torque15 | | 2 | 3 | |
| Sine | Sine34 | 1.5, 60 | | | 3 |

Building block connectivity can also be described in other ways. For example, one can use a keyword such as connect to indicate which two building blocks are involved in a connection. Another convention, which uses a pair-wise method, is specified by the MODELICA® equation-based language. An example of this convention is illustrated by the following statements:

connect(Sine34.y,Torque15.tau);

connect(Torque15.flange_b,inertia 17.flange_a);

connect(Fixed25,Spring21.flange_a);

For the pair-wise format, the XLDyn add-in maintains a one-to-one mapping of the connection point shape names and the standard keyword in the MODELICA® equation-based language, such as y for an output of a signal block and flange_a for the left side of a rotational building block. The XLDyn add-in uses the pair-wise format for exporting to a dynamic systems simulator (DSS) that is compliant with the MODELICA® equation-based language and the netlist format for its built-in solver.

The XLDyn add-in checks the validity of connections during the creation of the system model. For example, a building block cannot be connected to itself. In addition, a signal port connector must always start from the output port of the source building block. For mechanical elements, other rules may apply. For example, kinematic constraint elements, which impose a constraint on connected masses such as gear and one-way clutches, and dynamic elements, which transmit a force (e.g., springs and dampers), must be connected to a pair of masses or to a mass and ground. Another rule that may apply to mechanical elements is that a mass cannot be directly connected to another mass or to ground. If the XLDyn add-in identifies an object or objects that violate the rule, it highlights any identified objects and issues a message to alert the user.

A model in a worksheet may contain one or more submodels, or superblocks, that are stored in separate worksheets. These submodels may in turn contain other superblocks. The XLDyn add-in allows the user to connect an element to a superblock and further allows the user to connect a superblock to another superblock. When the user makes such a connection involving a superblock, the XLDyn add-in interprets the intent as making a connection to elements contained within the superblock. The XLDyn add-in may make a connection involving a superblock using a method described below in connection with FIG. 15.

According to another aspect, forms and visual cues can be used to facilitate connection of superblocks to one another. Because superblocks are stored in separate worksheets, connecting elements across superblock boundaries cannot be done with connectors in the EXCEL® spreadsheet environment. The XLDyn add-in can, however, connect superblocks to one another.

Figure 12:
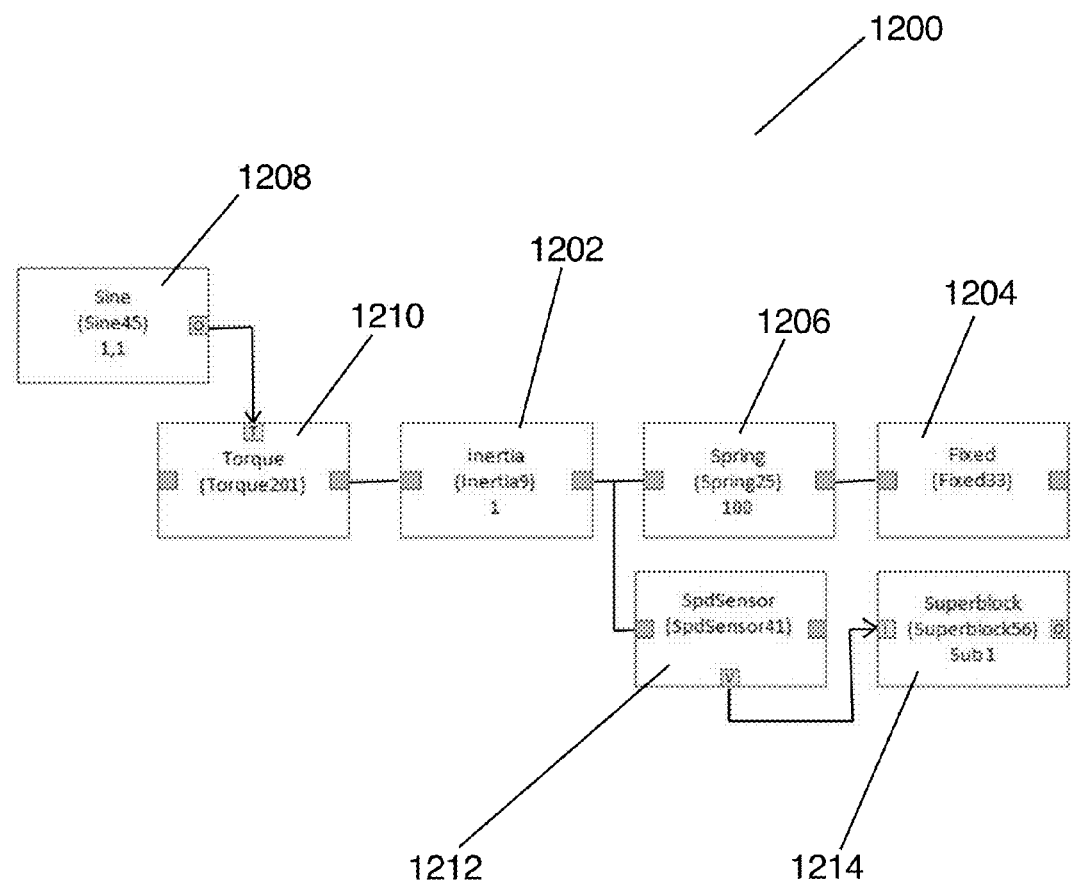
FIG. 12 illustrates an example graphical representation of another system.

FIG. 12 illustrates a graphical representation 1200 of an example drivetrain model in which a lumped mass, represented by Inertia building block 1202, is connected to ground, represented by Fixed building block 1204, through a spring, represented by Spring building block 1206. A sinusoidal torque is applied to the lumped mass with a signal source, represented by Sine building block 1208, and an interface building block 1210. A SpdSensor building block 1212 monitors the velocity of the Inertia building block 1202 and reports the velocity to an element within a superblock 1214.

Figure 13:
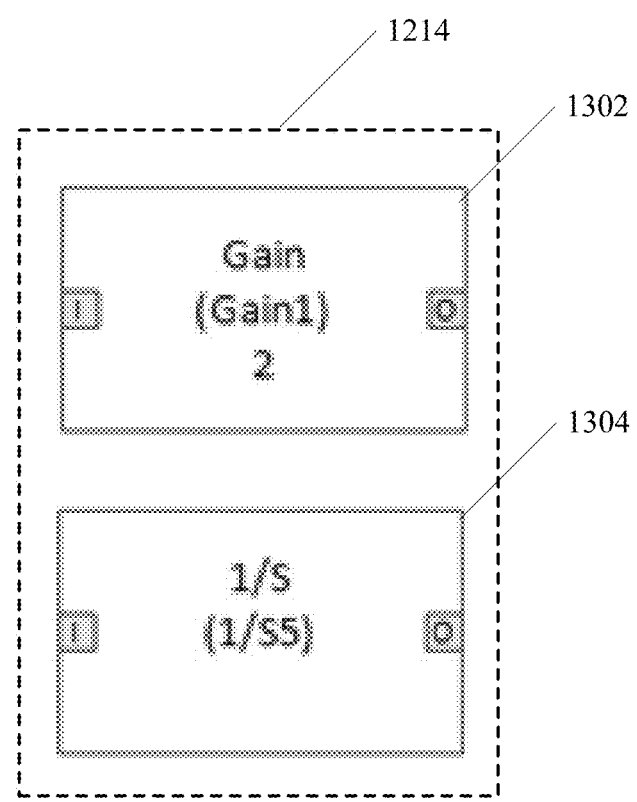
FIG. 13 illustrates a collection of elements making up a superblock forming part of the system illustrated in FIG. 12.

The superblock 1214 contains two building blocks 1302 and 1304, as shown in FIG. 13. In particular, the superblock 1214 comprises a Gain building block 1302 and an Integrator building block 1304. The velocity output by the SpdSensor building block 1212 of FIG. 12 can be connected to either or both of the Gain building block 1302 and the Integrator building block 1304. The XLDyn add-in provides the forms and functions to help the user make the connection between elements that are contained in different worksheets, such as Main (containing the system model) and Sub 1 (containing the superblock 1214) in this example.

Figure 14:
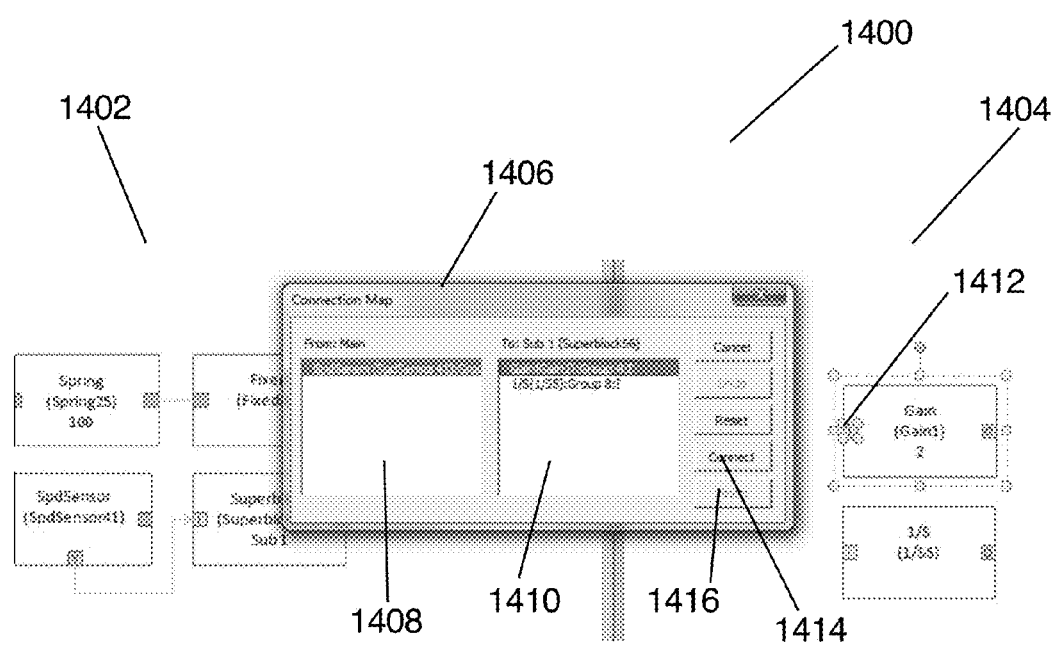
FIG. 14 is an example graphical user interface presented to a user in accordance with one aspect.

When the user clicks on a "Create Topology" button, the XLDyn add-in splits the interface 1400 into two side-by-side windows 1402 and 1404, as shown in FIG. 14. The left window 1402 contains the reference model, and the right window 1404 contains the superblock 1214. A form 1406 appears that lets the user choose an output from a listbox 1408 to be connected to an input selected from a listbox 1410. In the example illustrated in FIG. 14, the user creates a connection between the velocity output of the SpdSensor building block 1212 and both the Gain building block 1302 and the Integrator building block 1304. When the user selects an item in the listbox 1410, for example, Gain1, the XLDyn add-in highlights the corresponding connection point in the graphical representation of the system model, e.g., the rectangle 1412. When the user clicks a Connect button 1414, the XLDyn add-in connects the highlighted items. The XLDyn add-in then refreshes the listbox 1410 by showing unconnected input ports of the superblock 1214. Because the input on the Gain building block 1302 is now connected, only the Integrator building block 1304 appears in the listbox 1410 when it is refreshed. At this point, the user may complete the connection process between the system model in Main worksheet and superblock 1214 by: (1) clicking a Connect button 1414, which connects the SpdSensor building block 1212 to the Integrator building block 1304, or (2) clicking a Finish 1416 button, in which case the input to the Integrator building block 1304 will remain unconnected and will be available for connection with another building block.

To avoid the need to repeat the connection process whenever topology is created, the XLDyn add-in saves the user selections (i.e., the connection map) in a worksheet and makes the worksheet available for reuse. The XLDyn add-in also detects changes to the submodels that may invalidate the selections, e.g., deletion of the Gain building block 1302. The saved connection map can only be reused if it remains valid.

Figure 15:
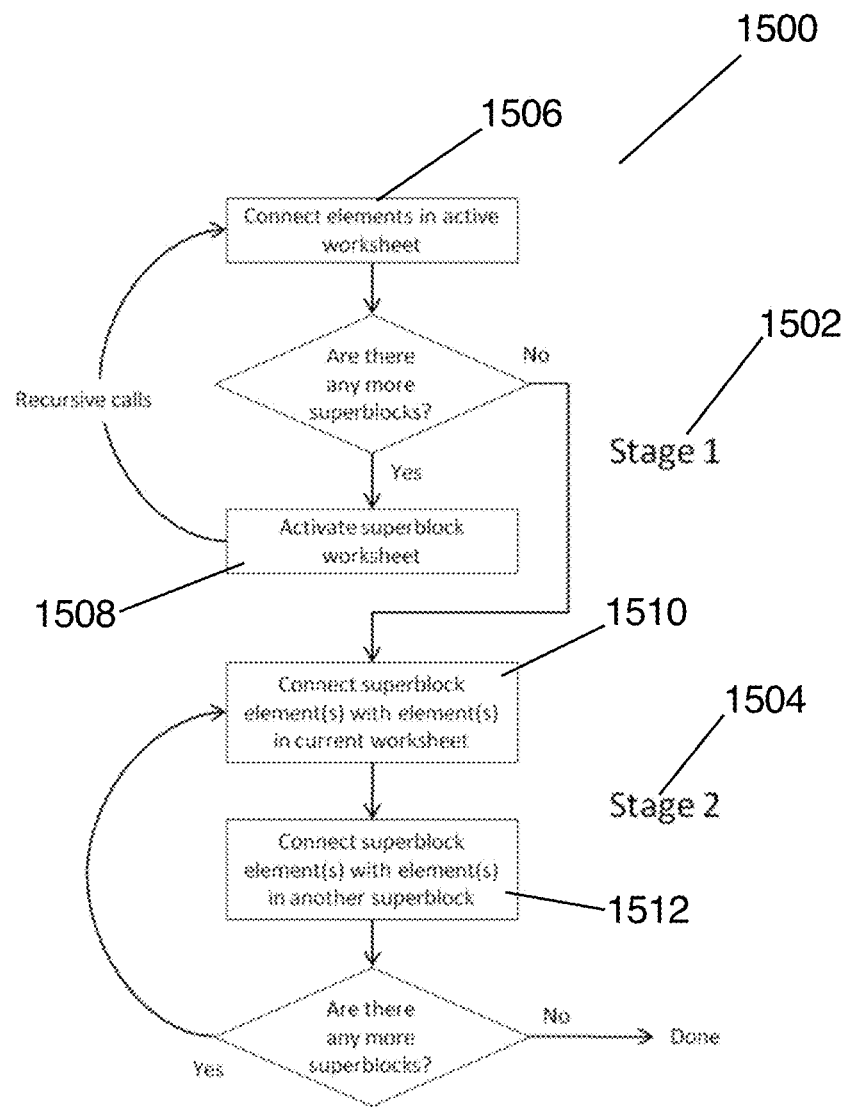
FIG. 15 is a process flow diagram illustrating a process for recursively discovering superblocks.

In the above example, the superblock 1214 is connected to the Inertia building block 1202 as the recipient, or sink, of an output signal. According to another aspect, superblocks can be discovered recursively, and elements within a superblock can be connected to elements outside the superblock. In general, a superblock can be connected to another superblock either as a source or as a sink. Moreover, superblocks can be nested, and several superblocks can be within a worksheet. The XLDyn add-in uses a recursive process to find the superblocks and asks the user to connect the elements as described above in connection with FIGS. 12-14. FIG. 15 is a flow diagram illustrating an example implementation of a recursive process 1500 that is suitable for this purpose. The process 1500 has two broadly-defined stages 1502 and 1504.

In the first stage 1502, the XLDyn add-in uses a subroutine, such as a ConnectElements subroutine, to scan all of the connectors starting with a worksheet. If the building blocks that are connected by a connector are both elements, then the building blocks are connected using the method described above in connection with FIG. 11 at a step 1506. If one or both building blocks are superblocks, then the XLDyn add-in opens the worksheet that contains the superblock or superblocks at a step 1508 and again uses the ConnectElements subroutine to make the connections. In the process of making connections with elements contained in the superblock, the ConnectElements subroutine is invoked while it is still active. This technique is known as recursion and is commonly used to address problems with potentially infinitely repeating relationships.

The purpose of the first stage 1502 is to identify input ports that are connected to another element and that are thus not candidates for the second stage 1504 of the process 1500.

In the second stage 1504, the XLDyn add-in connects the elements to a superblock or connects superblocks to other superblocks. The XLDyn add-in uses the method described above in connection with FIGS. 12-14 to make the element-to-element connection. In the second stage 1504, the XLDyn add-in may connect superblock elements with elements in the current worksheet at a step 1510. The XLDyn add-in may also connect superblock elements with elements in another superblock at a step 1512. When no superblocks remain, the second stage 1504 and the process 1500 are completed.

Changes in properties, such as the spring rate, do not affect system topology. In many cases, the user may want to perform a simulation by merely changing the values of certain parameters or by adding elements to a submodel. The process 1500 avoids the need to repeat the interactive connection process described above in connection with FIGS. 12-14 each time the model is modified. To facilitate the process, the XLDyn add-in uses a journaling technique, which saves the user actions described above in connection with FIGS. 12-14 for later playback. Journaling can be used if no changes are made to element-to-superblock connections. For example, if block A in a worksheet is connected to block B in another worksheet and the user subsequently deletes block B, then the journal is invalidated and cannot be used. The XLDyn add-in recognizes these types of topology changes and automatically invalidates the journal in such scenarios.

Figure 16:
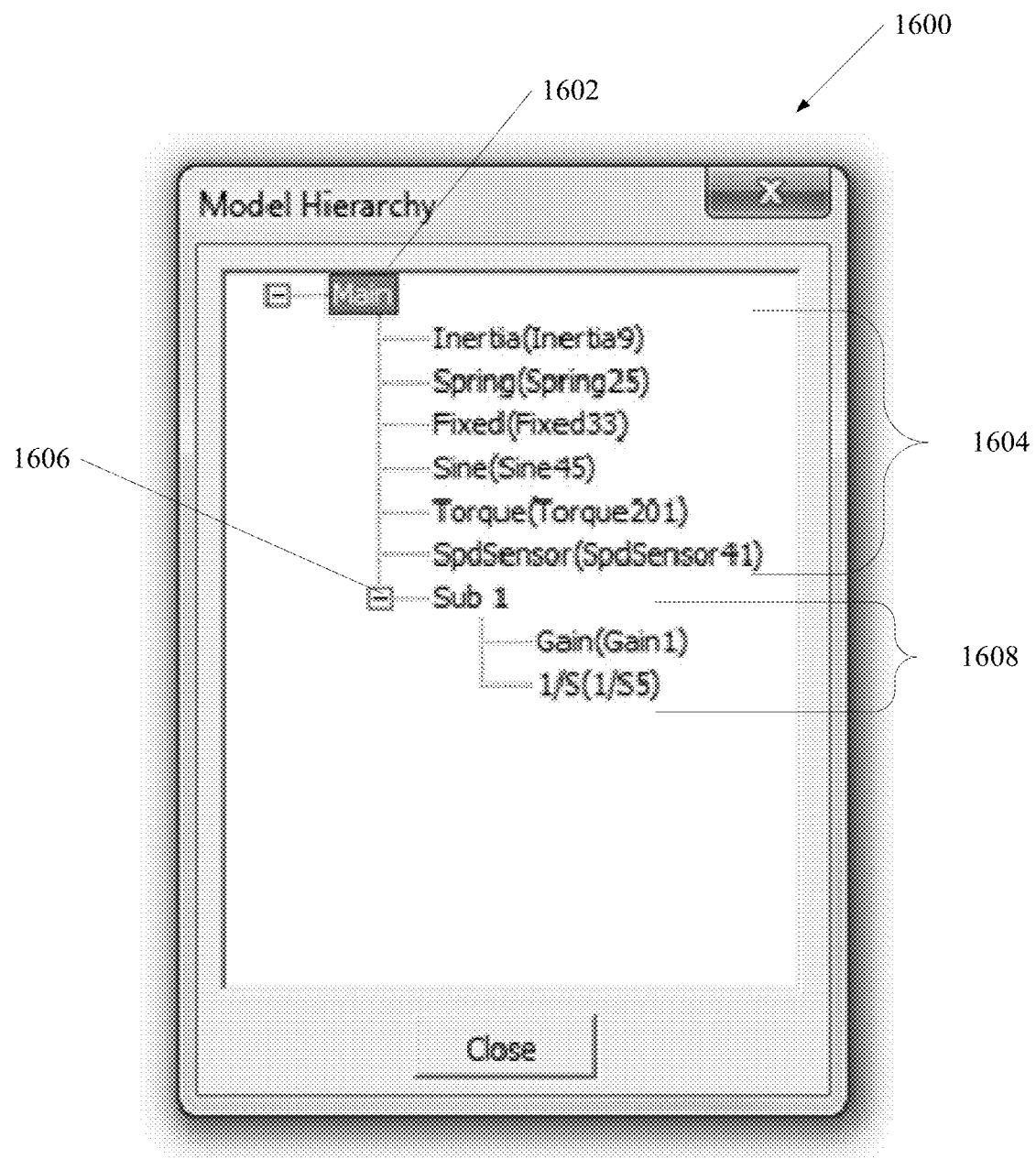
FIG. 16 illustrates an example representation of a model hierarchy.

In another aspect, a tree ActiveX control is used to visualize the model hierarchy. In particular, the XLDyn add-in records the parent-child relationship of each superblock as part of the recursive discovery process described above in connection with FIG. 15. The user can click a command button to view the model hierarchy, a representation 1600 of which is shown in FIG. 16. As shown in FIG. 16, the representation 1600 includes a top level 1602, as well as a number of building blocks 1604 and a superblock 1606 positioned one level down from the top level 1602. The superblock 1606, in turn, has two elements 1608 positioned one level down from it.

In another aspect, a model description file can be read from a third party DSS application. Many third party DSS applications can produce text-based model description files that follow a certain format or standards. Using the known format or standards, the XLDyn add-in can import model description files from third party DSS applications as part of the create/edit model process. The XLDyn add-in deciphers the model information and stores the deciphered information in internal memory as objects in the EXCEL® spreadsheet environment, as though the model had been created interactively by the user. Model information includes building block properties and parameters, governing equations, and information relating to how the building blocks are connected to one another. Some third party DSS applications also include in their model description files graphical information, such as font size, colors, placement, etc. The XLDyn add-in can extract, translate, and render the graphical information as shapes in the EXCEL® spreadsheet environment to the extent that the information is available and the format and standards are known. For third party DSS applications that support the MODELICA® equation-based language, the XLDyn add-in extracts the model information by recognizing the structure and keywords of the MODELICA® equation-based language. In particular, the XLDyn add-in extracts the graphical information from the annotation section.

Figure 17:
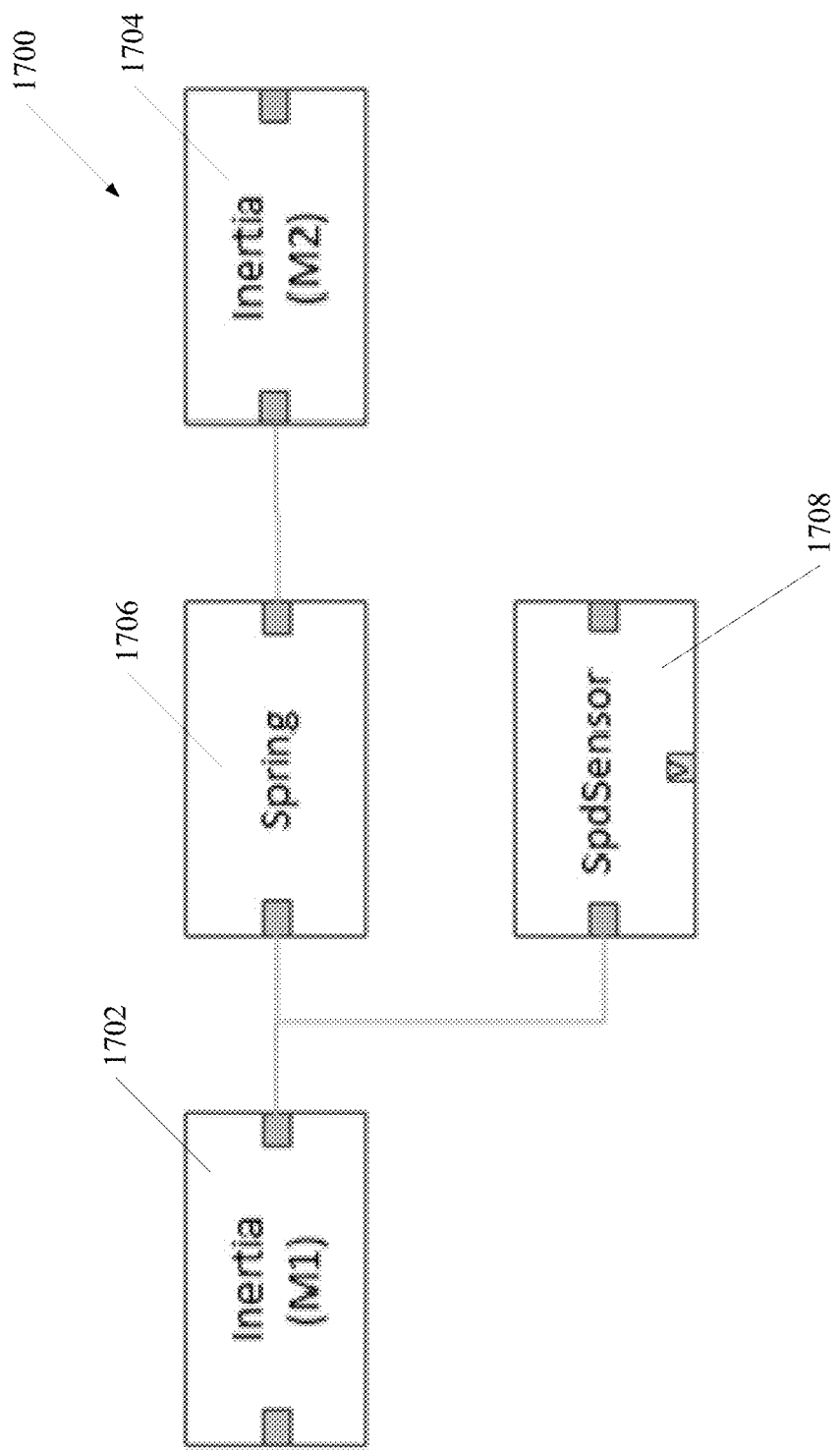
FIG. 17 illustrates an example graphical representation of yet another system.

Advantageously, the element design used by the XLDyn add-in is consistent with third party DSS applications. One design involves having a node representing the center of mass. Springs, clutches, and other mechanical blocks can then be connected to this node. FIG. 17 illustrates a graphical representation 1700 of such a design. This design includes two masses 1702 and 1704 connected by a spring 1706. The mass 1702 and the spring 1706 are also connected to a SpdSensor building block 1708.

Figure 18:
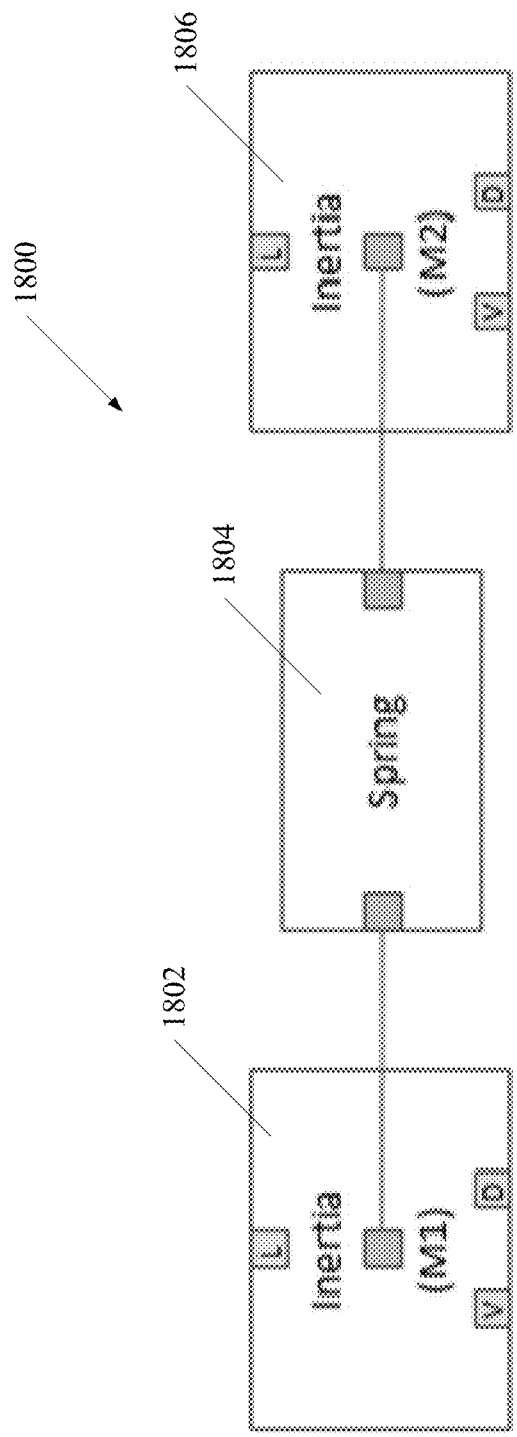
FIG. 18 illustrates an example graphical representation of still another system.

Alternatively, the Inertia element may be designed to have no signal ports. In this case, an interface element may be used to convert the mass velocity into a signal source. FIG. 18 illustrates a graphical representation 1800 of such a design, which includes two masses 1802 and 1804 connected to a spring 1806.

The choice of which design to adapt is relatively unimportant. What is important is that the XLDyn design is compatible with the third party DSS, such that the building blocks that are imported from one system can be used directly in the other system.

Clearly, it is impossible for XLDyn building block designs to be the same as building block designs for all third party DSS applications. One alternative involves having a set of XLDyn building block designs for each third party DSS application. Another alternative involves the XLDyn add-in patterning its building block design after a recognized standard, such as the MODELICA® equation-based language.

Models created by the XLDyn add-in, with or without importing from a third party DSS application, can be simulated with the solver built into the XLDyn add-in. Such models can also be exported as text files for simulation in a third party DSS application that shares the same building block design as the XLDyn add-in. Creation of the text file is basically the reverse of the parsing process. Building block parameters, properties, and connectivity information that are stored in the internal memory associated with the XLDyn add-in are written to the text file according to agreed upon specifications. Graphical properties, such as color, shapes, and location, while not needed for dynamic system simulation, should also be written out to the file for use by the third party DSS application.

According to another aspect, interoperability between MICROSOFT OFFICE® software and .NET can be leveraged to launch the solver built into the XLDyn add-in and to post-process simulation results. As a .NET application, the XLDyn add-in can access objects in the EXCEL® spreadsheet environment through interoperability between MICROSOFT OFFICE® software and .NET. For example, the XLDyn add-in can open a workbook and directly read from and write to the worksheets contained in the workbook. The XLDyn add-in uses this interoperability to facilitate the use of macros as described above in connection with FIGS. 4-7. This interoperability also facilitates the writing of simulation results to the workbook at the end of the simulation.

If the user chooses to use a third party DSS solver, the XLDyn add-in can read the simulation results produced by the other solver and use interoperability between MICROSOFT OFFICE® software and .NET to write them to the XLDyn Results worksheet. In some cases, the dynamic system may have many variables to plot. A filter may be used to select certain variables for plotting.

In another aspect, controls in the EXCEL® spreadsheet environment can be used to facilitate the selection and replacement of building block properties. For design iteration, the user may want to change some building block properties prior to simulation. For example, the user may want to select from one of several possible values of a property, or key in the value of a property. The XLDyn add-in uses dialog boxes with the appropriate controls for the user to enter the data.

To identify a property value as being replaceable at runtime, the XLDyn add-in allows a property value to be entered as a constant, e.g., a spring value of 100, or as a character string that follows a certain convention. In one embodiment, for example, the XLDyn add-in uses the convention x=c, where x is a unique symbol and c is a constant. For a spring, one example is srate=100. The XLDyn add-in interprets this string as a spring having a runtime replaceable spring rate, with a default value of 100.

Figure 19:
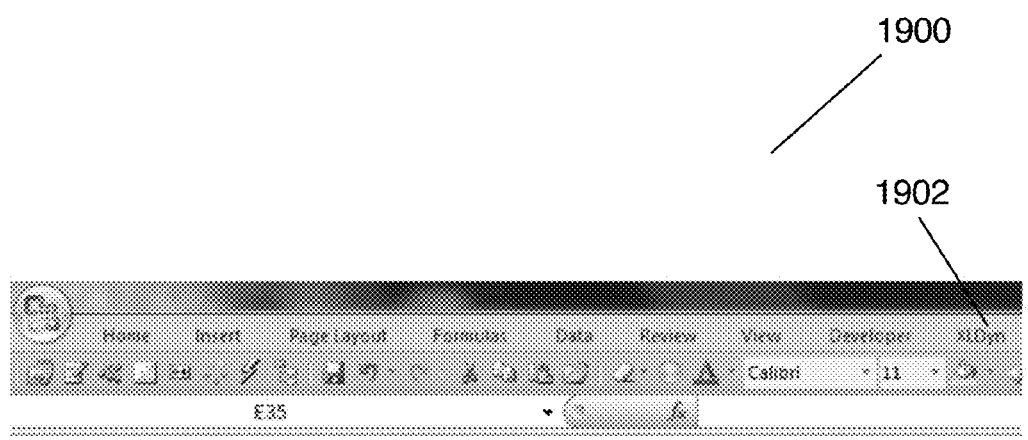
FIG. 19 shows an example ribbon user interface for dynamic system modeling and simulation with a ribbon minimized.
Figure 20:
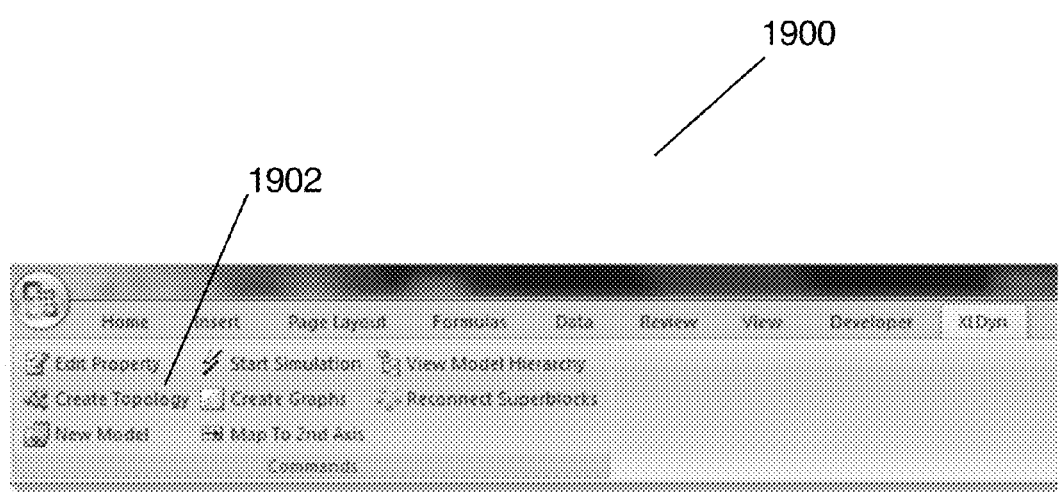
FIG. 20 shows the ribbon user interface of FIG. 19 with the ribbon maximized.

In another aspect, a custom ribbon user interface is used to facilitate system modeling and simulation. Functions associated with the XLDyn add-in are coded as command buttons that appear on the Ribbon user interface in the MICROSOFT OFFICE® software, as shown in FIGS. 19 and 20. FIG. 19 shows an example ribbon user interface 1900 with a ribbon 1902 minimized FIG. 20 shows the ribbon user interface 1900 with the ribbon 1902 maximized.

Figure 21:
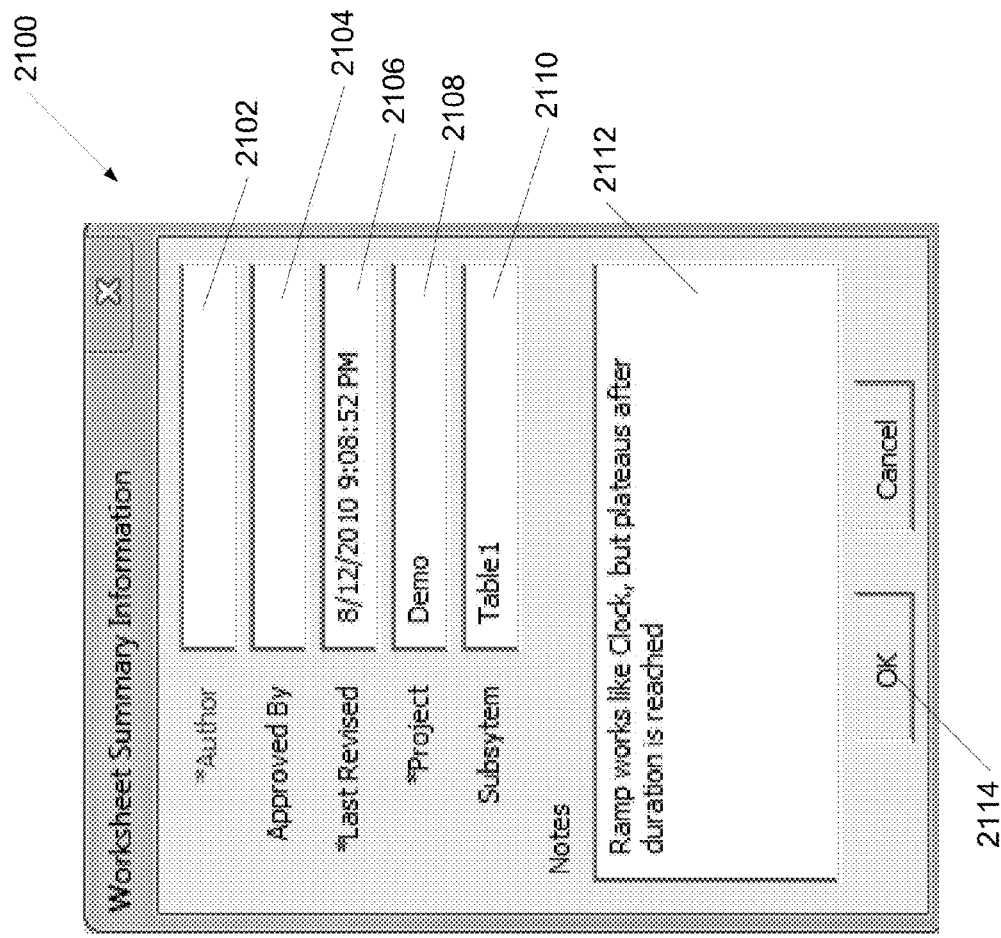
FIG. 21 illustrates an example dialog box for collecting information for use in a documenting textbox in accordance with another aspect.
Figure 22:
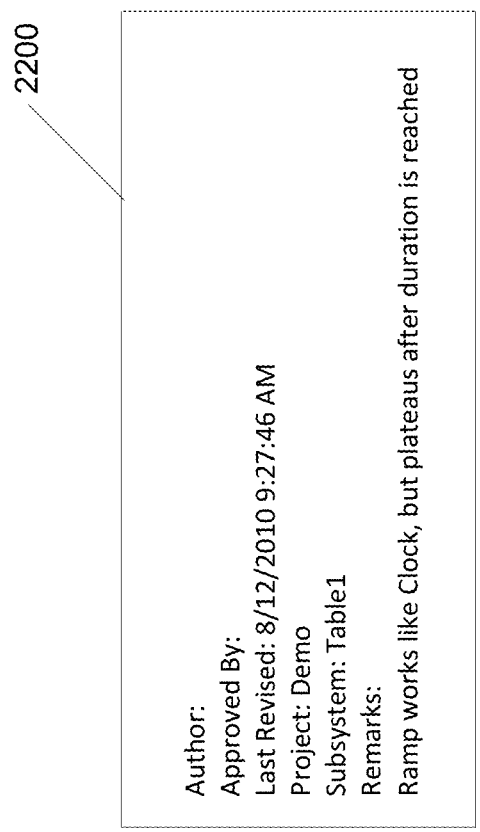
FIG. 22 illustrates an example documenting textbox.

According to another aspect of this disclosure, textboxes with identifying features, hereinafter referred to as "documenting textboxes," can be used to document models that are contained in worksheets. Documenting textboxes are reserved for use by the XLDyn add-in and are distinguished from textboxes that may have been inserted for other reasons. For example, a documenting textbox may include model attributes, such as information identifying the author, the approver, the revision date, validation status, as well as ad hoc comments and other information. Accordingly, a documenting textbox can be distinguished from other textboxes by the presence of certain headers, such as "Author:," "Revision Date:," etc. FIG. 21 illustrates an example dialog box 2100 for collecting information for use in a documenting textbox. The dialog box 2100 and possibly other dialog boxes facilitate data entry and ensure that these distinguishing headers are preserved in a documenting textbox. The dialog box 2100 includes an input field 2102 for entering an author's name, an input field 2104 for entering an approver's name, an input field 2106 for entering a revision date, an input field 2108 for entering a project name, an input field 2110 for entering a subsystem name, and an input field 2112 for entering notes. When the user clicks on a button 2114, a documenting textbox is created or updated. FIG. 22 depicts an example documenting textbox 2200 created in response to the user entering data in the dialog box 2100. The documenting textbox 2200 may be associated with one or more shapes in a worksheet or with the worksheet as a whole. For example, the documenting textbox 2200 may be displayed on the worksheet that contains the model.

Documenting textboxes can be discovered programmatically by scanning a workbook or worksheet for such textboxes, and their contents extracted for a variety of uses. For example, the user can use the contents of documenting textboxes to perform a structured search to identify, for example, all models that are authored by a person or persons in a given time period. A structured search is one where the search algorithm is targeted at a predefined location or locations. Alternatively, the user can use the contents of documenting textboxes to perform a free-form search, for example, for comments that include a certain character string. Free-form searches are useful in the extraction, transformation, and loading of concepts, a rapidly evolving technology with applications in search and data warehousing. The contents of documenting textboxes can also be extracted and used to populate sections of a report template. For example, author information, approver information, model description information, and other information can be extracted from documenting textboxes to partially populate a report.

In some embodiments, a macro may be written to allow a user to document each worksheet by author, approver, revision dates, and other project information. This documentation can be summarized along with the contents of the worksheet in another worksheet, such as an XLDyn Summary worksheet. The summary information can be filtered using a filter function of the spreadsheet environment to identify, for example, subsystems that are under development or issues that have been discovered with certain building blocks.

In some embodiments, a search function implemented in the XLDyn add-in programmatically scans objects in the EXCEL® spreadsheet environment that are used and managed by the XLDyn add-in. The scope of the search can be limited to a single workbook. Alternatively, the scope of the search can be extended to workbooks in one or more folders in which dynamic system models can be stored. Such folders can be located in a client computing device or remotely, e.g., in a device attached to a local area network or connected to the client computing device via the Internet. The search domain may include objects such as, for example, documenting textboxes, building blocks, and named ranges, which can be used to tag data location.

Figure 23:
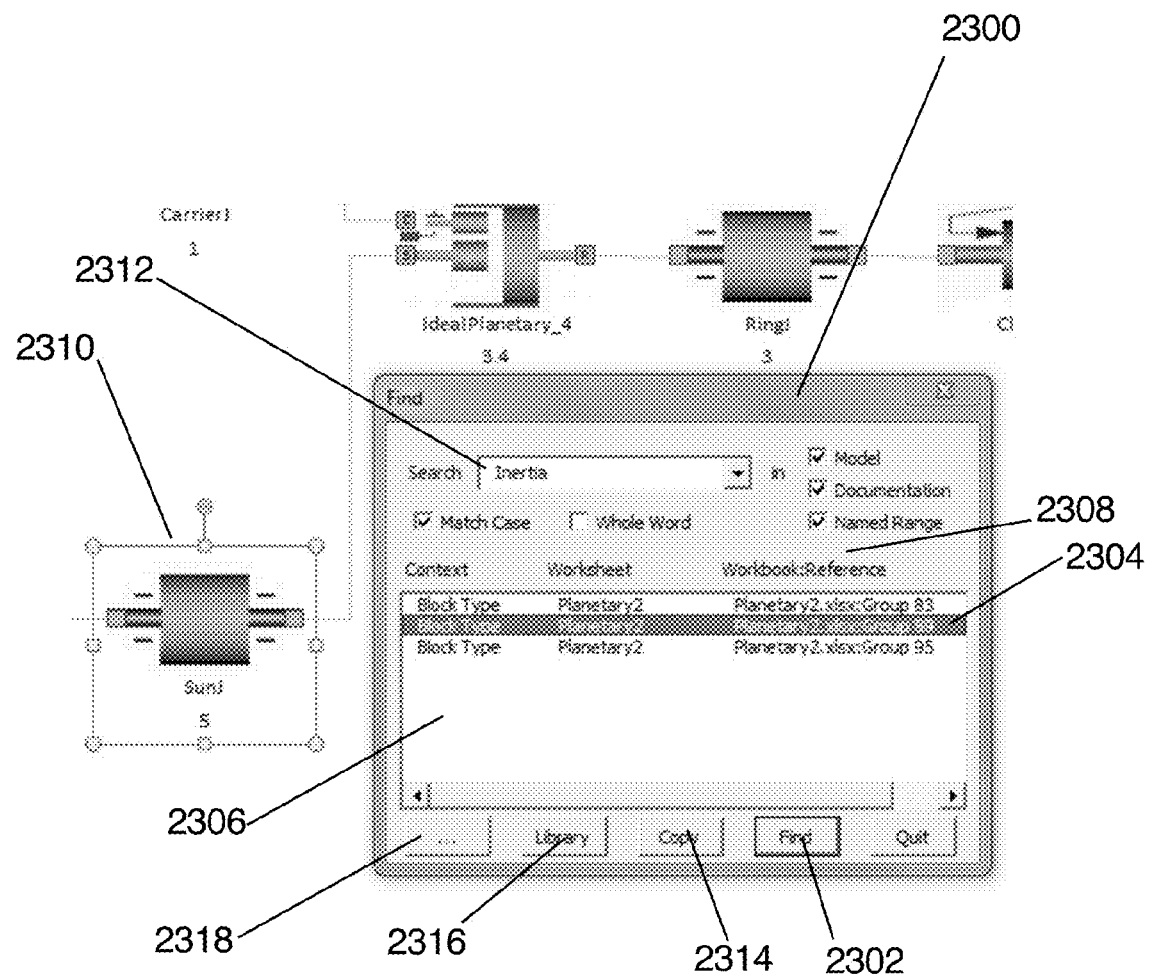
FIG. 23 illustrates an example search dialog box.

FIG. 23 illustrates an example search dialog box 2300 in which the user includes building blocks, documenting textboxes, and named ranges in the search domain. When the user clicks on a Find command button 2302, the XLDyn add-in scans all worksheets in the search scope for objects that match the search criteria. For example, when looking for Inertia building blocks, the XLDyn add-in includes any shape that contains the character "I" and the word "Inertia" in its name as a hit. In the example shown in FIG. 23, the search results within the workbook scope include three inertia building blocks, all in the Planetary2 worksheet. When the user selects an item 2304 from a listbox 2306, the system uses the information in a Workbook:Reference column 2308 to locate and highlight the selected SunJ building block 2310.

The example search dialog box 2300 employs a search input field 2312. The search input field 2312 may be a combo box that allows the user to enter a text string or to select from a pre-populated list. The search input field 2312 may be pre-populated with objects supported by the XLDyn add-in, including the building blocks and labeling textboxes described below in connection with FIGS. 26 and 27.

Figure 24:
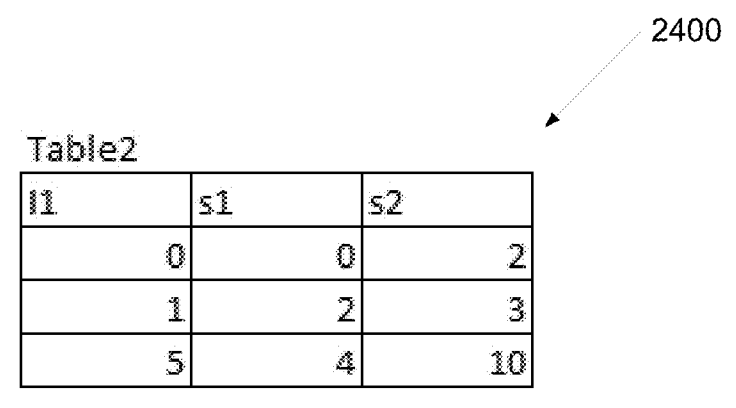

Selecting a Copy command button 2314 allows the user to copy an item found during a search, such as a named range Table2 2400 depicted in FIG. 24, to the clipboard. The object can later be pasted elsewhere in the spreadsheet or to another active application. Selecting a Library command button 2316 allows the user to expand the search to the default folder in which models are stored. Selecting a Browse command button 2318 allows the user to expand the search to other folders.

Figure 25:
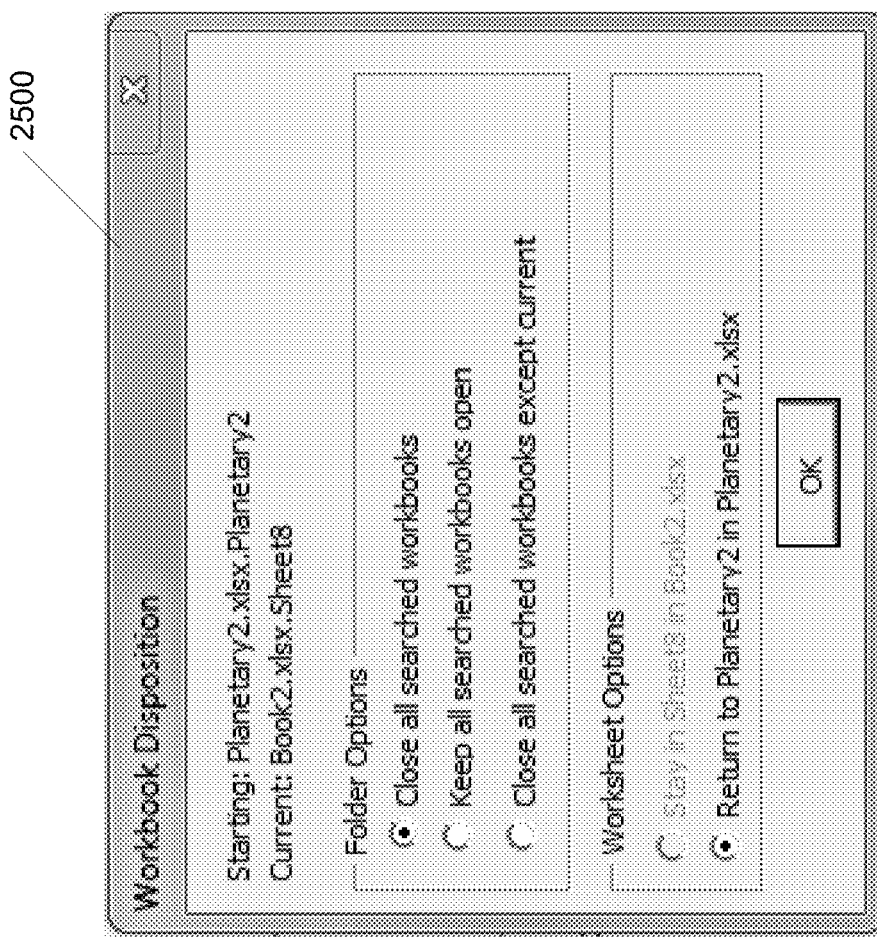
FIG. 25 illustrates an example worksheet disposition dialog box.

When the user selects an item that causes the system to navigate away from the worksheet where the search was started, the system displays a worksheet disposition dialog box 2500, as shown in FIG. 25, when the search ends. In some embodiments, the user can only return to the starting worksheet if he or she chooses to close all newly opened workbooks. In such embodiments, the option to stay in the current worksheet is available if the user chooses to either keep all searched workbooks open or close all of the searched workbooks except for the current workbook.

Figure 26:
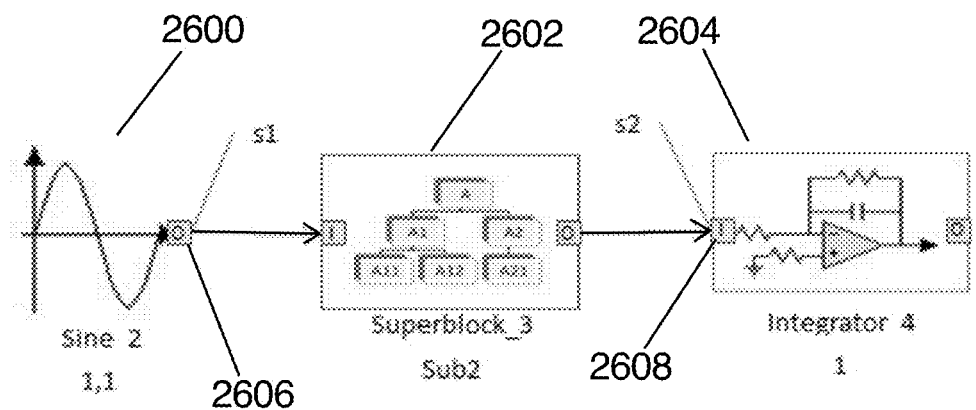
FIG. 26 illustrates an example set of building blocks.
Figure 27:
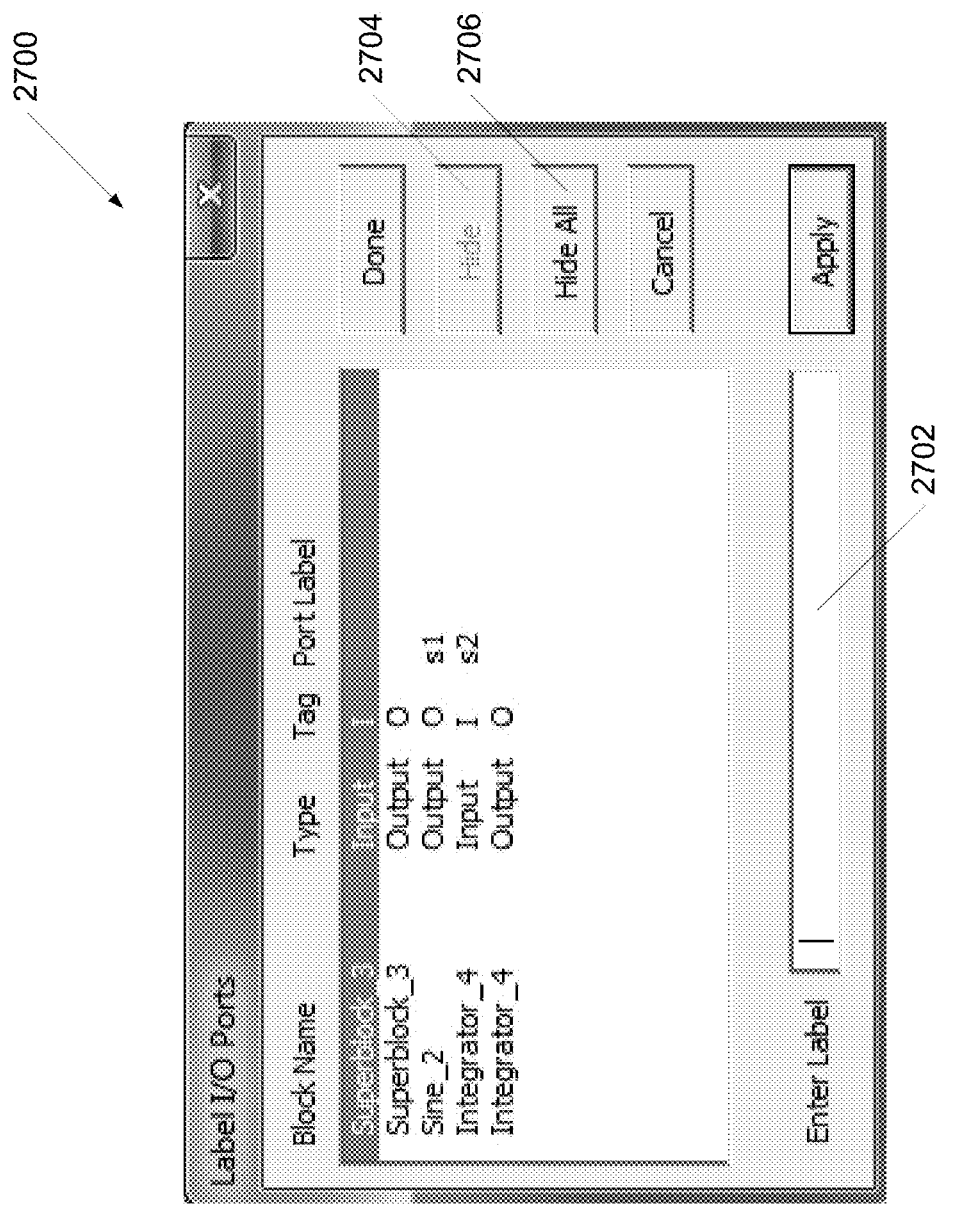
FIG. 27 illustrates an example dialog box for labeling an input or an output of a building block of the set of building blocks of FIG. 26.

In some embodiments, textboxes can be used to label connection points. FIG. 26 depicts an example set of building blocks 2600, 2602, and 2604. If a user wishes to label an output 2606 of the Sine2 building block 2600 as s1 and an input 2608 of the Integrator4 building block 2604 as s2, the user could manually insert a textbox, enter the appropriate text, and connect the textbox to the output 2606 or the input 2608 with a line connector. To facilitate this otherwise tedious process, the XLDyn add-in may provide a dialog box 2700 as depicted in FIG. 27. A labeling textbox is programmatically created and attached to the output 2606 or the input 2608 when the user enters a label for the output 2606 or the input 2608 using an Enter Label text input box 2702. Similarly, an existing labeling textbox and its connecting line are programmatically deleted when the corresponding label is erased from the text input box 2702. A Hide command button 2704 and a Hide All command button 2706 are toggles for hiding or showing labeling textboxes.

In some embodiments, a labeling textbox can be used to automatically connect components across superblocks. As discussed above, a superblock is a set of components that typically represents a subsystem. The superblock components are contained in a worksheet, but the superblock itself appears as an icon in a container worksheet. The Super-block_3 building block 2602 of FIG. 26 is one example of a superblock. Components in different superblocks cannot be connected in the usual manual fashion because they reside in different worksheets. Labeling textboxes provide a way to automatically make connections across worksheets.

Figure 28:
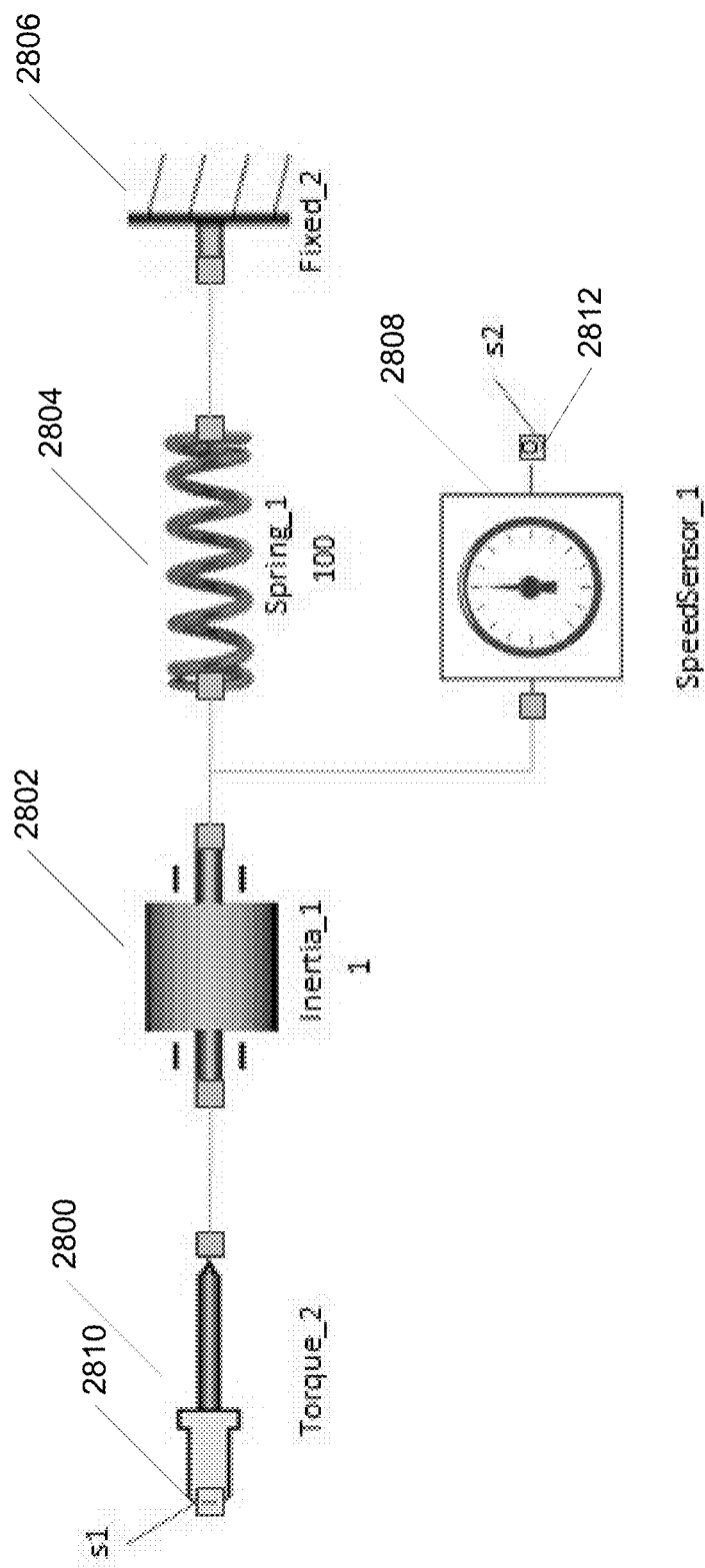
FIG. 28 illustrates an example set of building blocks forming a superblock.

FIG. 28 illustrates a set of building blocks 2800, 2802, 2804, 2806, and 2808 that comprise the Superblock_3 building block 2602 of FIG. 26. If the user labels the input and output ports as shown in FIG. 28, the XLDyn add-in will automatically connect the Sine output from the container worksheet to an input 2810 of the Torque_2 building block 2800 because the two ports—input 2810 and the output 2606 of the container worksheet of FIG. 26—have been assigned the same label, s1. Similarly, an output 2812 of the Speed-Sensor_1 building block 2808 will be connected to the input 2608 of the container worksheet of FIG. 26 because both ports have been assigned the same label, s2. The connections are made in a logical sense, in that the same result—the ports being flagged as connected—is achieved as if the connection were made manually. Programmatically, the matching is achieved by scanning the two relevant worksheets for ports that have labeling textboxes with the same label. This automatic connection functionality can be used in conjunction with another functionality, linking a component property to a worksheet range, to facilitate run-time subsystem replacement as described below in connection with FIG. 32.

Figure 29:
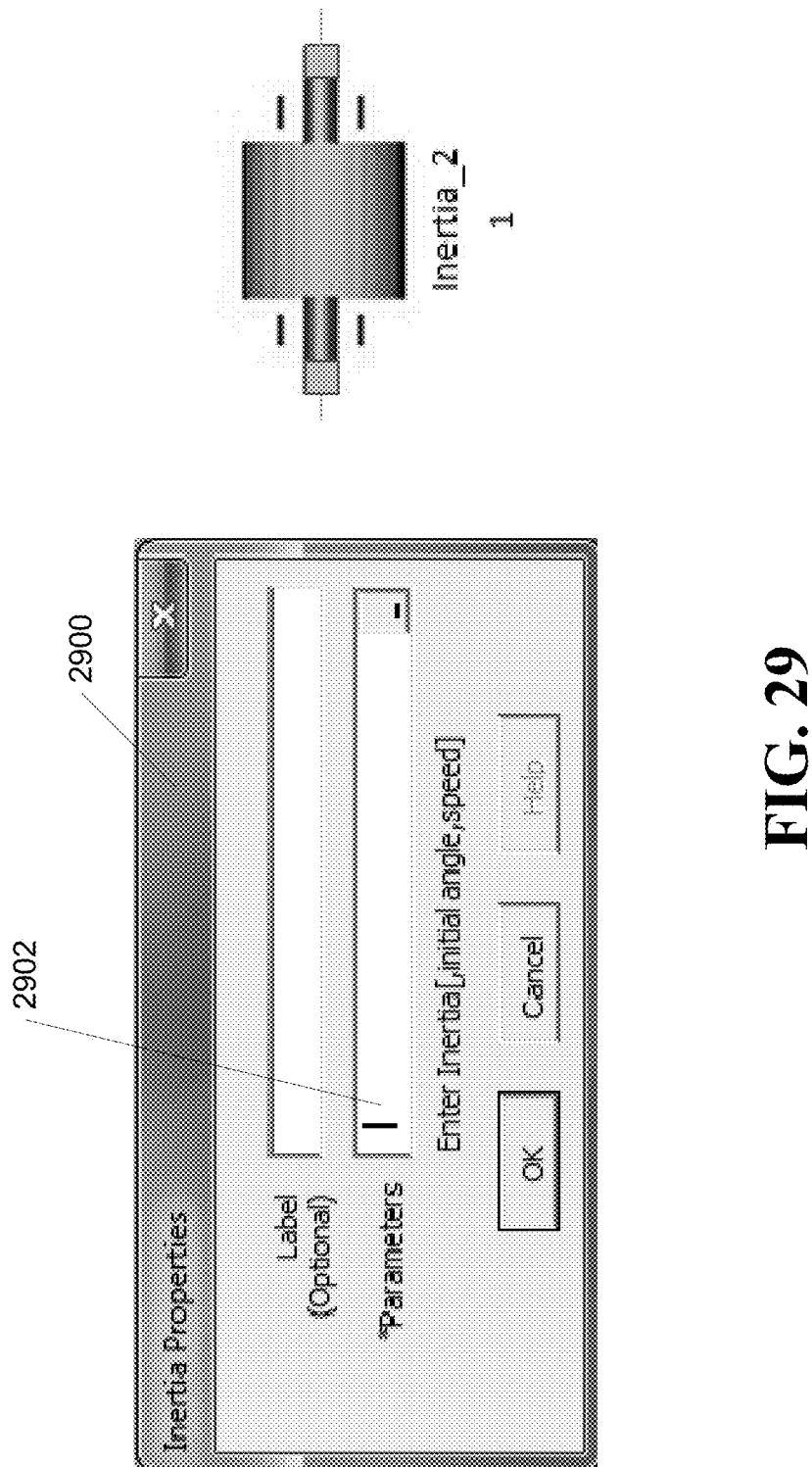
FIG. 29 illustrates an example dialog box for entering a property value for a component.

Component properties can be modified by using a dialog box 2900, as shown in FIG. 29, or by directly entering the property values into the building block. Both processes can be performed manually and repeated each time a simulation is run. According to some embodiments, however, linking a component property to a worksheet range provides flexibility that facilitates automation. In the dialog box 2900, a *Parameters input box 2902 is a RefEdit control that allows the user to enter a string or specify a worksheet range. RefEdit controls are known in the art and are used to facilitate specification of ranges. If a range is specified, the XLDyn add-in will load the component property with whatever value is in the range immediately prior to the start of the simulation. Thus, the RefEdit control is the mechanism that links component properties to worksheet ranges.

Figure 30:
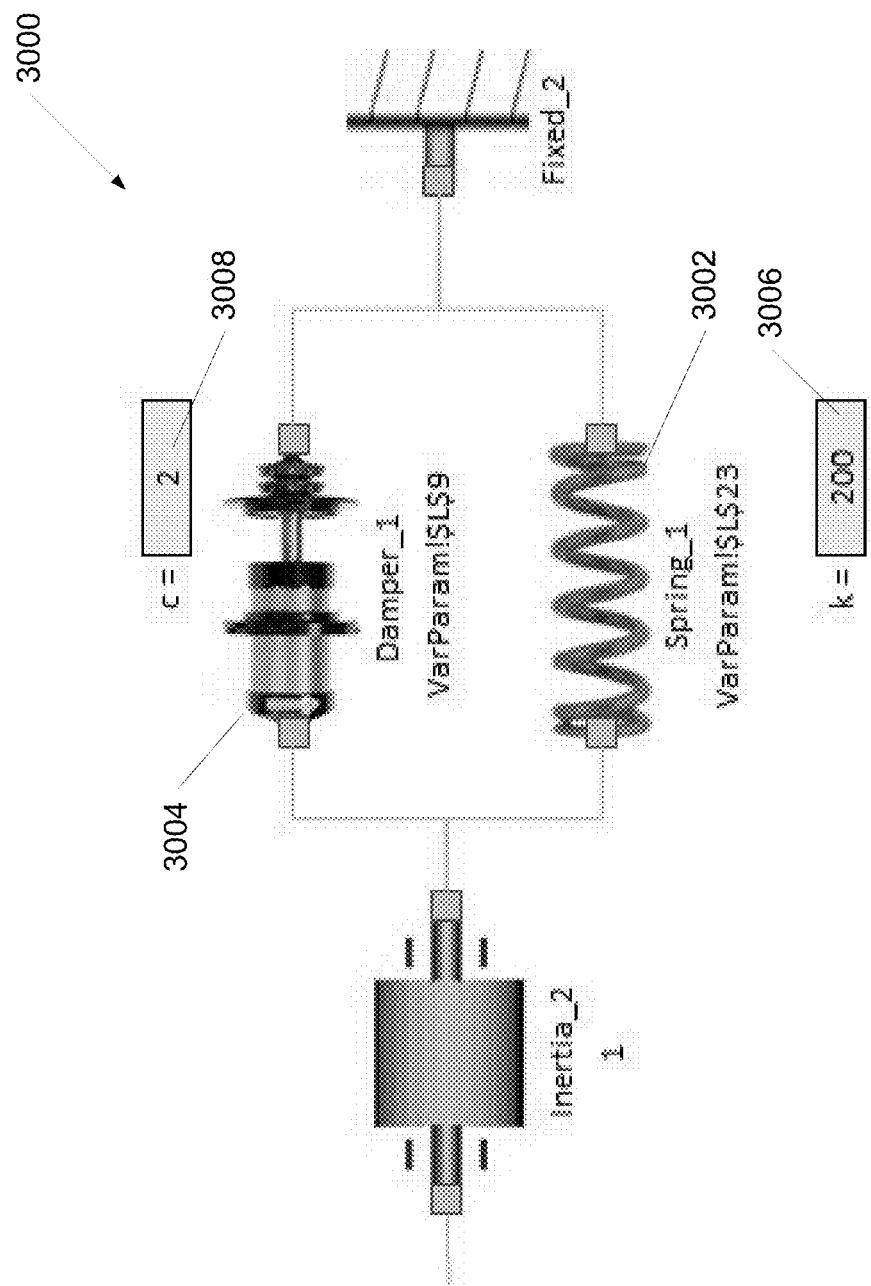
FIG. 30 illustrates an example worksheet linking parameters to worksheet ranges.

Linking component properties to worksheet ranges has a number of applications. FIG. 30 illustrates a worksheet 3000 having a building block 3002 representing a spring and a building block 3004 representing a damper. A cell 3006 stores a value that is linked to a spring rate k of the spring, while a cell 3008 stores a value that is linked to a damping coefficient c of the damper. Cells 3006 and 3008 are designated by the spreadsheet environment as L23 and L9, respectively. A formula "=L23/100" embedded in the cell 3008 sets the damping coefficient c equal to $\frac{1}{100}$ of the spring rate k.

Figure 31:
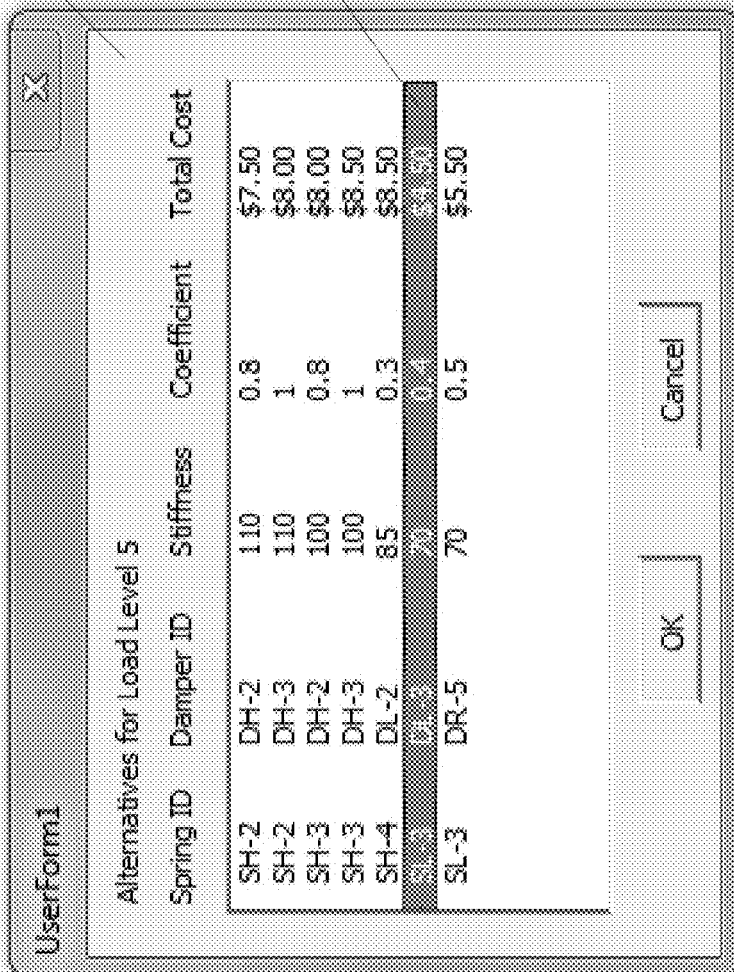
FIG. 31 illustrates an example user interface for executing a query and selecting from presented search results.

In addition, the XLDyn add-in can be integrated with a product database. A product database typically contains information about a company's product lines. A product database management (PDM) system that provides search capability based on product attributes may be useful when an engineer has to choose candidate components from available inventory. In some embodiments, a PDM system implemented using, for example, Microsoft ACCESS® brand database management software, may already have several pre-configured queries from which the user can select. FIG. 31 illustrates an example worksheet drop down menu 3100 that presents the pre-configured queries, including Query 1, which is based on spring rate, damping coefficient, cost, and load capacity. When the user clicks on a Run Query command button 3102, the XLDyn add-in invokes the pre-configured query and displays the results in a results dialog 3104. The user may then select an item 3106, after which the XLDyn add-in will process the selected item and load the results (in this case, a damping coefficient of 0.5 and a spring rate of 70) into the cells 3006 and 3008 of FIG. 30. It will be appreciated that the results loaded into the cells 3006 and 3008 may override any formulas that were embedded in the cells 3006 and 3008. Additional business logic may be used to display only items that meet certain criteria, such as total cost.

Figure 32:
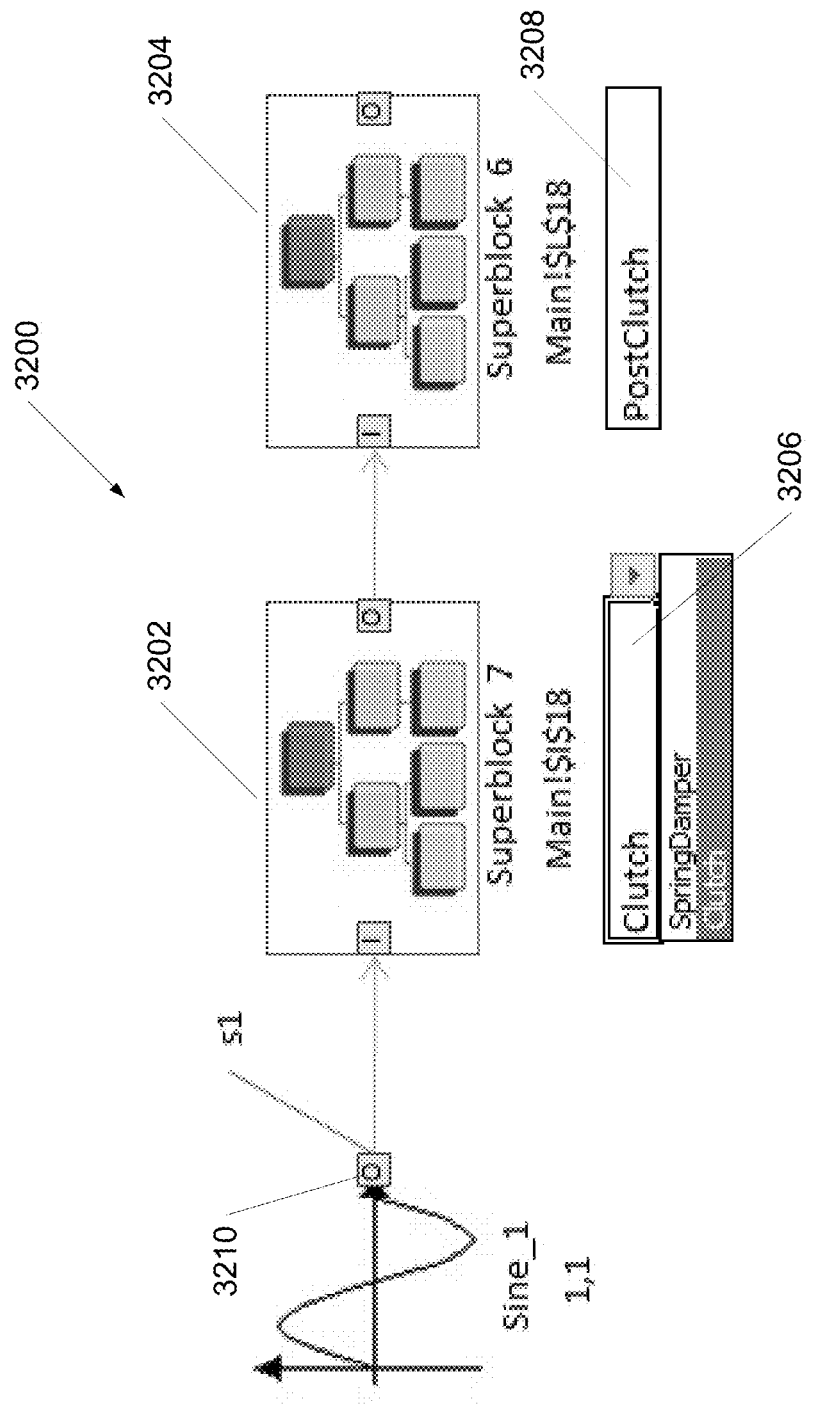
FIG. 32 illustrates an example worksheet in which superblocks have worksheet names as properties.

As another example application of linking component properties to worksheet ranges, connection of superblocks to one another can be facilitated. FIG. 32 illustrates an example worksheet 3200 in which two superblocks 3202 and 3204 have worksheet names as properties. These worksheet names are linked to cells 3206 and 3208, respectively, which are identified within the spreadsheet environment as I18 and L18, respectively. In the cell 3206, a combo box allows the user to select either Clutch or SpringDamper as the worksheet name of the superblock 3202. In the cell 3208, a formula "=IF (I18="Clutch","PostClutch","PostSpringDamper")" sets the worksheet name for the superblock 3204 depending on what was selected for the worksheet name of the superblock 3202. This type of scenario often arises in the real world. For example, one may choose either a standard engine or a high torque engine as a power source. The transmission choice, and possibly other subsystem choices, will depend on which engine was selected as the power source.

The ability to automatically connect components across superblocks can facilitate the modeling process as long as the connection points are labeled in a consistent manner. For the example shown in FIG. 32, a Sine output 3210 will be connected to any port that is labeled s1 in both the Clutch and SpringDamper subsystem.

While various applications of the ability to link component properties to worksheet ranges have been disclosed herein, it will be appreciated by those of ordinary skill in the art that other applications can be implemented and may be practiced without departing from the spirit and scope of the invention.

According to another aspect of this disclosure, a parametric study can be performed using simulation runs that are conducted to see how a system responds under various conditions. Some parameters that can be changed include, but are not limited to, component attributes, external load, and internal states. Non-technical attributes, such as cost, can also affect a design.

Figure 33:
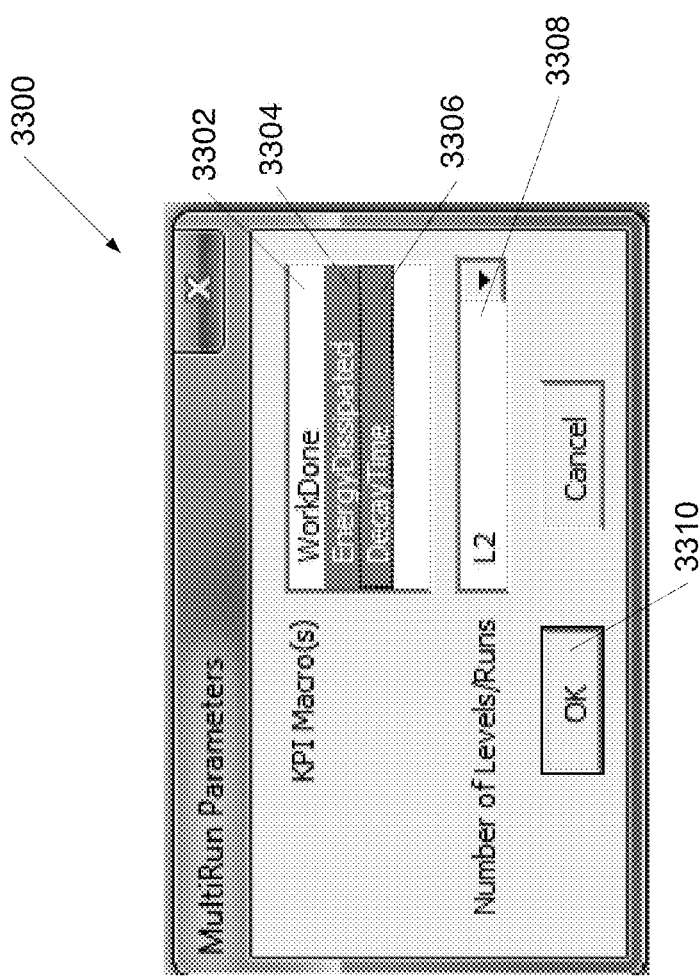
FIG. 33 illustrates an example dialog box for conducting a parametric study according to another aspect.

The XLDyn add-in supports parametric studies by presenting a dialog box, such as a dialog box 3300 of FIG. 33, in which one or more macros 3302, 3304, and 3306 may be selected for post-processing the results from the simulation runs. The macros are specific to the system and may be provided by the user. Each macro provides logic for calculating a key performance index (KPI) based on results written to the XLDyn Results worksheet.

Figure 34:
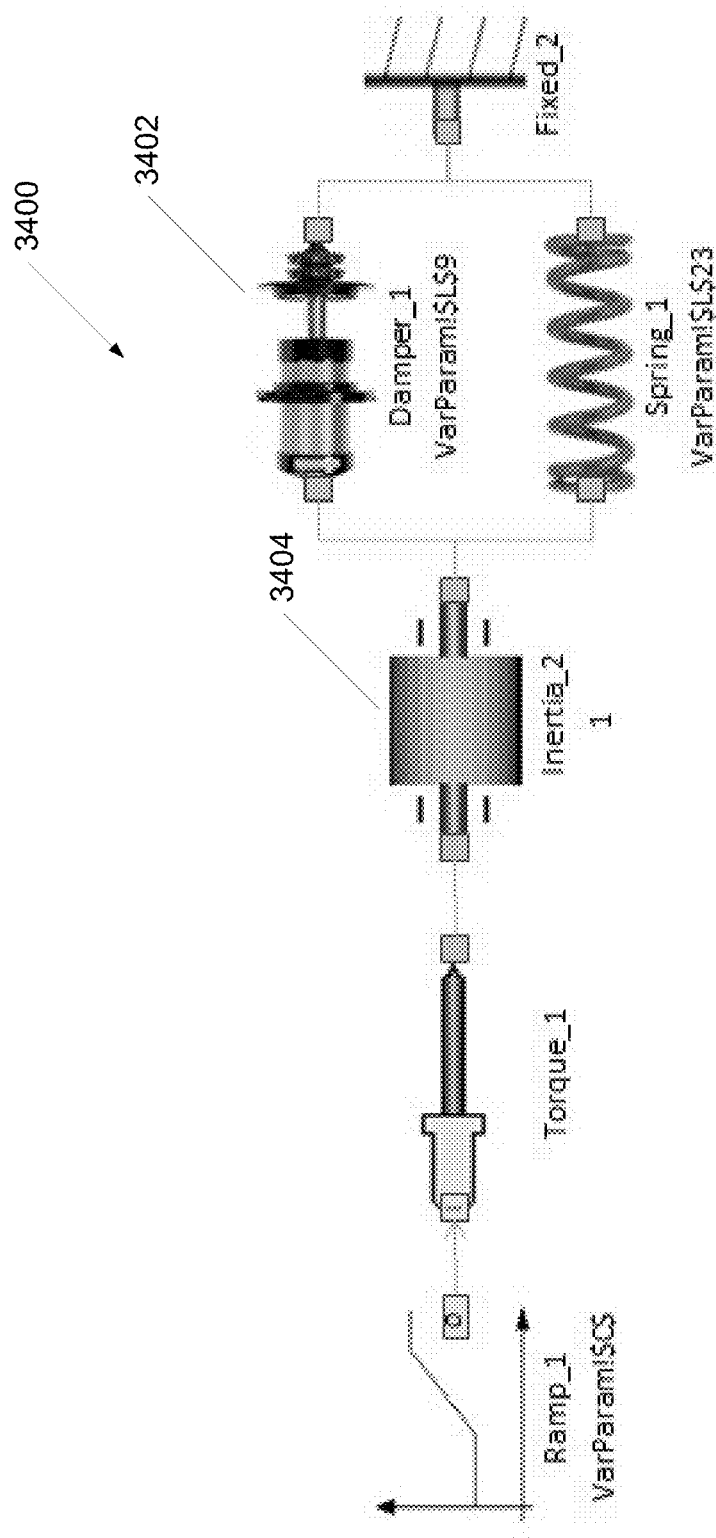
FIG. 34 illustrates an example worksheet that may be a subject of the parametric study.

FIG. 34 illustrates an example worksheet 3400 that may be the subject of a parametric study. In the system represented in the worksheet 3400, the energy dissipated by the damper represented by a building block 3402 is the damping force multiplied by the distance traveled by the inertia represented by a building block 3404 integrated over time. The selected macro or macros can use the header row in the XLDyn Results worksheet, which contains all results available from the simulation, to locate the data columns that correspond to time, damping force, and distance traveled by the inertia.

For the parametric study, the user can also select the number of runs to be conducted, or select an experiment design. The dialog box 3300 of FIG. 33 presents a pulldown menu 3308 for selecting a number of levels or runs to be conducted. The choice L2 refers to the number of levels in a design of experiment study. A variety of designs are publicly available that specify the various combinations of parameter values needed for an optimization study or for fitting a response surface.

If the user selects a two-level design and clicks on a command button 3310 of the dialog box 3300 of FIG. 33, the XLDyn add-in will display on the XLDyn MultiRun worksheet a table that lists the entire parameter set (5 in the current example) along with their current settings. The parameter set may be obtained by scanning the worksheet for shapes that represent XLDyn building blocks, (i.e. those having the character "|" as part of their names), and extracting the parameter names and values from the shape name. If a worksheet contains one or superblocks, the scanning will extend to the worksheets associated with those superblocks in a recursive manner. One example table is shown below as Table 3:

TABLE 3

| Level | Inertia_2 J | Spring_1 c | Damper_1 d | Ramp_1 height | Ramp_1 duration | Energy Dissipated | Decay Time |
|---|---|---|---|---|---|---|---|
| 1 | 1 | 500 | 6.25 | 5 | 1 | | |
| 2 | 1 | 500 | 6.25 | 5 | 1 | | |

The above Table 3 shows the initial values of the parameters for each level of the experiment design. The user can modify these values as appropriate.

The user may omit some of the parameters from the study by deleting the corresponding data columns Parameters omitted from the study remain set at their current values for all simulation runs. The user may set the level values of parameters that are to be varied. Table 4 shows the partial factorial matrix corresponding to a two-level design where, for example, the spring rates are set at 200 and 400, damping coefficients at 4 and 10, ramp heights at 5 and 10, and ramp durations at 2 and 5.

TABLE 4

| Run | Spring_1 c | Damper_1 d | Ramp_1 height | Ramp_1 duration | Energy Dissipated | Decay Time |
|---|---|---|---|---|---|---|
| 1 | 200 | 4 | 5 | 2 | | |
| 2 | 200 | 4 | 5 | 5 | | |
| 3 | 200 | 10 | 10 | 2 | | |
| 4 | 200 | 10 | 10 | 5 | | |

TABLE 4-continued

| Run | Spring_1 c | Damper_1 d | Ramp_1 height | Ramp_1 duration | Energy Dissipated | Decay Time |
|---|---|---|---|---|---|---|
| 5 | 400 | 4 | 10 | 2 | | |
| 6 | 400 | 4 | 10 | 5 | | |
| 7 | 400 | 10 | 5 | 2 | | |
| 8 | 400 | 10 | 5 | 5 | | |

To support multiple runs, the XLDyn add-in retains the value of each component property in the memory of the computing device. As the XLDyn add-in performs the series of simulation runs (8 in the example of Table 4) in an execution loop, the property values are updated with the values in the XLDyn MultiRun worksheet at the beginning of each run. At the end of each run, the XLDyn add-in writes the latest simulation results to the XLDyn Results worksheet and invokes the user-provided post-processor macros to calculate the corresponding KPI values. The KPI values (in this case, the dissipated energy and decay time) are then written to the two right-most columns of the table. The user has now concluded the runs involved in a design of experiment study. The user may use the completed matrix, for example, to determine the optimal combination of design parameters.

Figure 35:
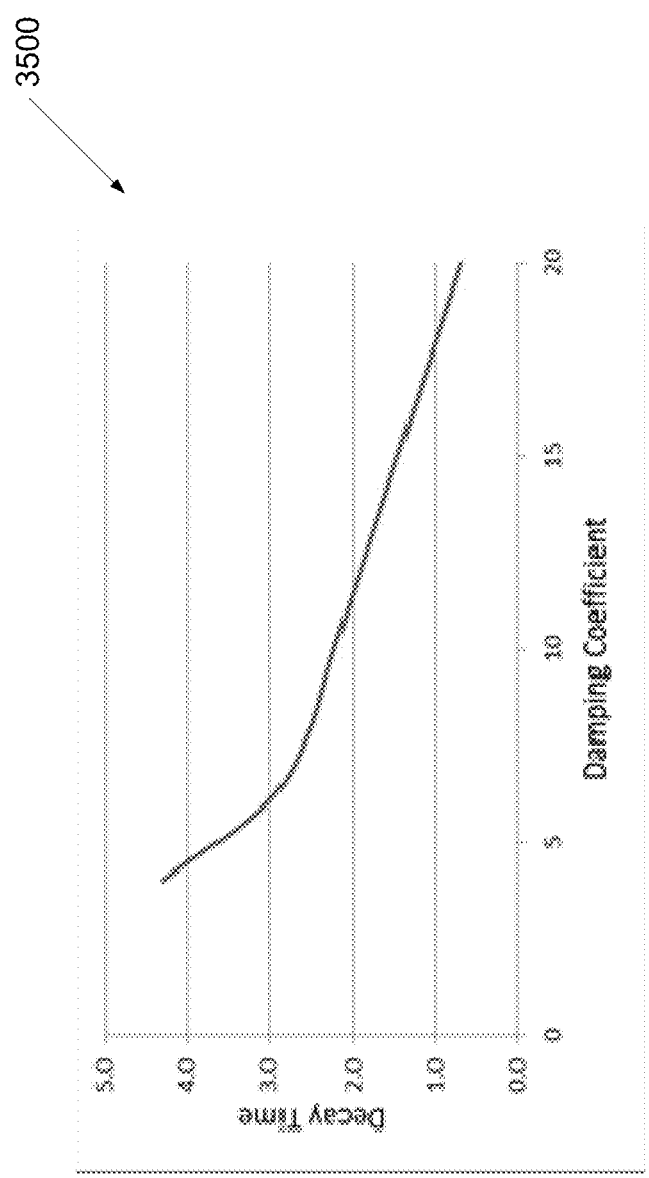
FIG. 35 illustrates an example plot resulting from a parametric study.

The user may enter a desired number of runs instead of selecting an experiment design. In this case, the XLDyn add-in displays a table similar to Table 4, which the user can edit to suit his or her purposes. The following Table 5 represents an example in which the user wants to study the effect of damping on decay time. FIG. 35 illustrates an example plot 3500 that can be created based on the data in Table 5 using the native plotting capability of the spreadsheet environment.

TABLE 5

| Run | Damper_1 d | Decay Time |
|---|---|---|
| 1 | 4 | 4.310 |
| 2 | 6 | 3.030 |
| 3 | 8 | 2.760 |
| 4 | 10 | 2.220 |
| 5 | 10 | 0.680 |

According to another aspect of this disclosure, templated information, which follows a specified pattern or rule, that is stored in a worksheet or a file can be used to create components. A graphical user interface (GUI) provides a set of components that are processed during the course of modeling and simulating a dynamic system. In particular, the GUI is able to draw a component on the canvas, e.g., a worksheet. Typically, the GUI adds to the worksheet several rectangles at the desired location, where each rectangle represents a part of the component. For example, a base block may represent the component type, while one or more smaller rectangles may represent the component's connection points. Because each component is unique, the macro for drawing the component will differ from component to component. In some conventional implementations, the macros for drawing the components can potentially number in the hundreds.

According to some embodiments, a single macro can be used to handle many or most of the components used in the modeling process. These attributes may include graphical characteristics such as, for example, font, color, size, location, and shape. Attributes may also include functional characteristics, such as, for example, the number and type of connections, engineering properties and variables, and governing equations. Some attributes may be both graphical and functional in nature, such as the number and type of connections.

The attributes may be stored in a worksheet or plain text files. Table 6 shows a worksheet with example attributes filled out for a number of building blocks.

TABLE 6

| Family | Block Type | No. of Input | I/O Port Name | Connector Names | Parameter Names | hScale | wScale | Pin Locations |
|---|---|---|---|---|---|---|---|---|
| Rotational | Inertia | 0 | | flange_a, flange_b | J | | | L0.5, R0.5 |
| Rotational | Fixed | 0 | | flange_b | | | | R0.5 |
| Rotational | Spring | 0 | | flange_a, flange_b | c | 0.6 | 1 | L0.5, R0.5 |
| Rotational | Damper | 0 | | flange_a, flange_b | d | 0.8 | 1 | L0.5, R0.5 |

A template should be targeted at a particular simulation environment. For example, what the MODELICA® simulation environment terms as Inertia has flange_a and flange_b as its connection points. Another simulation environment may term the same physical component Mass and may assign it only one connection point. The embodiments disclosed herein assume the use of the MODELICA® simulation environment because it is a standardized language that has growing acceptance.

To help the user fill out an attribute template, a dialog box may be used. Completed templates can be stored in a memory device, for example, as plain text files. Alternatively, the templates may be stored in workbooks or in a database. Storing the templates in a database provides the usual advantages that databases have over plain text files. The use of attribute templates provides the user with an opportunity to customize the graphical and functional characteristics of a component.

To draw a component, the XLDyn add-in extracts information from the attribute worksheet or file. The XLDyn add-in extracts graphical attributes involved in drawing the icon, including the number and type of connection points, scaling parameters, etc. The location of the icon is not generally specified in the template because it depends on where the user wishes to place a particular instance of the component. Some attributes may be omitted from the template. For example, to promote simplicity, the shape can be set to a rectangle whose size and aspect ratio are initially fixed but can be adjusted by using scaling factors. In addition, colors for the rectangles can be set by component and connection types and not specified in the template. A picture can be used instead of a rectangle to enhance the look and feel of a component. Attributes that are specific to a particular instance of a component may be collected from the user using a dialog box, e.g., the dialog box 2900 of FIG. 29.

After the component is drawn, the attributes of the component may be concatenated to form the name of the component, as disclosed above. Information for export to the MODELICA® simulation environment can then be extracted from the name of the component without having to use the template. Properties that cannot be conveniently stored in the name of a component, e.g., governing equations, can be written to a file, whose name can be concatenated as part of the name of the component. The MODELICA® simulation environment provides a set of standard components, which can be used in a model by reference. If such components are used in a model by reference, it is not necessary to include the governing equations because they are already in the Modelica class definition.

In another aspect, after a simulation run is made, a user may select a building block on a worksheet and click on a command button linked to an XLDyn graph function. The XLDyn add-in will display a graph showing simulation results associated with the selected building block, to the extent such results are available. Instead of a building block, the user may also display the model tree as discussed above, and select a node. Again, the XLDyn add-in will display a graph showing simulation results associated with the selected node, to the extent such results are available.

In another aspect, when multiple graphs are displayed in the same chart, and the graphs are of significantly different orders of magnitude, the XLDyn add-in may offer a dialog allowing user to choose some of the graphs to be displayed with a secondary y-axis. After user selects the desired graphs, the XLDyn add-in will display them with a different pattern, e.g. dashed line, to contrast them against graphs using the primary y-axis.

As demonstrated by the foregoing discussion, various embodiments may provide certain advantages, particularly in the context of modeling and simulating dynamic systems. For example, using a spreadsheet environment, such as Microsoft's EXCEL® spreadsheet environment, as a GUI for dynamic system simulation has a relatively quick learning curve and facilitates modeling and analyzing dynamic systems. The user can add instances of building blocks to the canvas and copy, cut, paste, connect, align, and distribute building blocks, all with familiar mouse and/or keyboard commands. Familiar commands can also be used to perform spell checking and other language-related functions, plot analysis results and create charts, write macros to automate modeling and simulation tasks, and access cell formulas. In addition, textboxes with identifying features can be used to document models contained in worksheets. Textboxes can be used to label connection points and to automatically connect components across superblocks. Component properties can be linked to ranges in a worksheet to facilitate automation of simulations.

It will be understood by those who practice the embodiments described herein and those skilled in the art that various modifications and improvements may be made without departing from the spirit and scope of the disclosed embodiments. The scope of protection afforded is to be determined solely by the claims and by the breadth of interpretation allowed by law.

As demonstrated by the foregoing discussion, various embodiments may provide certain advantages, particularly in the context of modeling and simulating dynamic systems. For example, using a spreadsheet environment, such as Microsoft's EXCEL® spreadsheet environment, as a GUI for dynamic system simulation has a relatively quick learning curve and facilitates modeling and analyzing dynamic systems. The user can add instances of building blocks to the canvas and copy, cut, paste, connect, align, and distribute building blocks, all with familiar mouse and/or keyboard commands. Familiar commands can also be used to perform spell checking and other language-related functions, plot analysis results and create charts, write macros to automate modeling and simulation tasks, and access cell formulas.

It will be understood by those who practice the embodiments described herein and those skilled in the art that various modifications and improvements may be made without departing from the spirit and scope of the disclosed embodiments. The scope of protection afforded is to be determined solely by the claims and by the breadth of interpretation allowed by law.

What is claimed is:

1. A method of modeling a dynamic system comprising a plurality of physical components, the method comprising:

using a computing device to provide a spreadsheet environment and a plurality of shape objects within the spreadsheet environment, the shape objects representing the physical components of the dynamic system, each shape object having a component property comprising at least one of a spreadsheet environment-given name, a component type, a number of inputs and outputs, or parameters unique to the component type, at least one shape object comprising a first superblock object representing a subsystem of the dynamic system, the components of the subsystem represented as a plurality of shape objects in a first worksheet of a workbook different from a second worksheet of the workbook in which other components of the system are represented, at least one shape object of the subsystem comprising a second superblock;

specifying a connection between at least two of the shape objects using a graphic connector in the spreadsheet environment, the graphic connector having at least one endpoint and having a property comprising respective identities of the at least two of the shape objects wherein a macro in the spreadsheet environment assigns a number or a symbol to each endpoint of the graphic connector to specify the connection between the at least two of the shape objects, the connection representing a relationship between the physical components represented by the connected shape objects, the connected shape objects comprising the superblock object and another shape object in a different worksheet in the spreadsheet environment from the superblock object;

generating, based on the shape objects and the connection, a model definition file; and exporting the model definition file to a third-party solver that is not within the spreadsheet environment to simulate operation of the dynamic system, the third-party solver programmatically creating an equation that models the time-dependent physical behavioral characteristic.

2. The method of claim 1, further comprising performing a search for at least one object created in the spreadsheet environment using an identifying feature as a search criterion.

3. The method of claim 2, further comprising:

in response to receiving a user selection of a first command button, performing the search in a default folder; and in response to receiving a user selection of a second command button, performing the search in at least one specified folder.

4. The method of claim 2, further comprising navigating to a previously opened workbook after performing the search.

5. The method of claim 1, further comprising associating a first textbox with a connection point of a shape object.

6. The method of claim 1, further comprising connecting a first component in a first superblock with a second component in a second superblock that is associated with a same identifier as the first component.

7. The method of claim 5, further comprising populating a report based on contents of the textbox.

8. The method of claim 1, wherein a RefEdit control is associated with a cell formula.

9. The method of claim 8, further comprising using the RefEdit control to link a property associated with a component of the dynamic system with a range in a worksheet in the spreadsheet environment.

10. The method of claim 8, wherein the RefEdit control is associated with a result of a query executed against a database.

11. The method of claim 8, wherein the RefEdit control is associated with a worksheet that is associated with a superblock.

12. The method of claim 1, further comprising using the spreadsheet environment to perform a parametric study by conducting a plurality of simulation runs simulating a response of the dynamic system to changes in one or more conditions.

13. The method of claim 1, further comprising using a macro to create a shape object based on templated information stored in at least one of a worksheet and a file.

14. The method of claim 1, further comprising, in response to a user selection of a command button, generating a graph representative of a simulation run and associated with at least one of a selected shape object and a selected portion of a model tree.

15. A non-transitory computer readable storage medium storing instructions that, when executed by a computer, cause the computer to model a dynamic system comprising a plurality of physical components by:
providing a spreadsheet environment and a plurality of shape objects within the spreadsheet environment, the shape objects representing the physical components of the dynamic system, each shape object having a component property comprising at least one of a spreadsheet environment-given name, a component type, a number of inputs and outputs, or parameters unique to the component type, the at least one shape object persisting a time-dependent physical behavioral characteristic that is associated with a physical component of the dynamic system and that is modeled using simultaneous differential algebraic equations;
specifying a connection between at least two of the shape objects using a graphic connector in the spreadsheet environment, the graphic connector having at least one endpoint and having a property comprising respective identities of the at least two of the shape objects wherein a macro in the spreadsheet environment assigns a number or a symbol to each endpoint of the graphic connector to specify the connection between the at least two of the shape objects, the connection representing a relationship between the physical components represented by the connected shape objects;
generating, based on the shape objects and the connection, a model definition file; and exporting the model definition file to a third-party solver that is not within the spreadsheet environment to simulate operation of the dynamic system, the third-party solver programmatically creating an equation that models the time-dependent physical behavioral characteristic.

16. The non-transitory computer readable storage medium of claim 15, storing further instructions for performing a search for at least one object created in the spreadsheet environment using an identifying feature as a search criterion.

17. The non-transitory computer readable storage medium of claim 16, storing further instructions for returning to a previously opened worksheet after performing the search.

18. The non-transitory computer readable storage medium of claim 16, further comprising:
in response to receiving a user selection of a first command button, performing the search in a default folder; and
in response to receiving a user selection of a second command button, performing the search in at least one specified folder.

19. The non-transitory computer readable storage medium of claim 15, storing further instructions for associating a first textbox with a connection point of a shape object.

20. The non-transitory computer readable storage medium of claim 19, further comprising using the textbox to connect a first component in a first superblock with a second component in a second superblock that is associated with a second textbox having a same identifier as the first textbox.

21. The non-transitory computer readable storage medium of claim 19, further comprising populating a report based on contents of the textbox.

22. The non-transitory computer readable storage medium of claim 15, wherein a RefEdit control is associated with a cell formula.

23. The non-transitory computer readable storage medium of claim 22, storing further instructions for using the RefEdit control to link a property associated with a physical component of the dynamic system with a range in a worksheet in the spreadsheet environment.

24. The non-transitory computer readable storage medium of claim 22, wherein the RefEdit control is associated with a result of a query executed against a database.

25. The non-transitory computer readable storage medium of claim 22, wherein the RefEdit control is associated with a worksheet that is associated with a superblock.

26. The non-transitory computer readable storage medium of claim 15, storing further instructions for using the spreadsheet environment to perform a parametric study by conducting a plurality of simulation runs simulating a response of the dynamic system to changes in one or more conditions.

27. The non-transitory computer readable storage medium of claim 15, storing further instructions for using a macro to create a shape object based on templated information stored in at least one of a worksheet and a file.

28. The non-transitory computer readable storage medium of claim 15, storing further instructions for, in response to a user selection of a command button, generating a graph representative of a simulation run and associated with at least one of a selected shape object and a selected portion of a model tree.

29. A computer system comprising:
a processor configured to receive and to execute processor-executable instructions;
a memory device in communication with the processor and storing processor-executable instructions that, when executed by the processor, cause the processor to model a dynamic system comprising a plurality of physical components by providing a spreadsheet environment and a plurality of shape objects within the spreadsheet environment, the shape objects representing the physical components of the dynamic system, each shape object having a component property comprising at least one of a spreadsheet environment-given name, a component type, a number of inputs and outputs, or parameters unique to the component type, at least one shape object comprising a first superblock object representing a subsystem of the dynamic system, the components of the subsystem represented as a plurality of shape objects in a first worksheet of a workbook different from a second worksheet of the workbook in which other components of the system are represented;

specifying a connection between at least two of the shape objects using a graphic connector in the spreadsheet environment, the graphic connector having at least one endpoint and having a property comprising respective identities of the at least two of the shape objects wherein a macro in the spreadsheet environment assigns a number or a symbol to each endpoint of the graphic connector to specify the connection between the at least two of the shape objects, the connection representing a relationship between the physical components represented by the connected shape objects, the connected shape objects comprising the superblock object and another shape object in a different worksheet in the spreadsheet environment from the superblock object;

generating, based on the shape objects and the connection, a model definition file; and exporting the model definition file to a third-party solver that is not within the spreadsheet environment to simulate operation of the dynamic system, the third-party solver programmatically creating an equation that models the time-dependent physical behavioral characteristic.

30. A method of modeling a dynamic system comprising a plurality of components, the method comprising:

using a computer to provide a spreadsheet environment;

defining a plurality of shape objects within the spreadsheet environment, the shape objects representing the components of the dynamic system, each shape object having a component property comprising at least one of a spreadsheet environment-given name, a component type, a number of inputs and outputs, or parameters unique to the component type, at least one shape object persisting a behavioral characteristic that is associated with a physical component of the dynamic system, at least one shape object comprising a first superblock object representing a subsystem of the dynamic system, the components of the subsystem represented as a plurality of shape objects in a first worksheet of a workbook different from a second worksheet of the workbook in which other components of the system are represented, at least one shape object of the subsystem comprising a second superblock; and using graphic connector objects in the spreadsheet environment to define connections between the shape objects and relationships between the components of the dynamic system, the graphic connector objects having respective endpoints and having properties comprising respective identities of connected shape objects wherein a macro in the spreadsheet environment assigns a number or a symbol to the endpoints of the graphic connector objects to specify the connections between the shape objects, at least one graphic connector object defining a connection between a superblock object and another shape object residing in a different worksheet in the spreadsheet environment from the superblock object.

\* \* \* \* \*